US008772060B2

United States Patent
Sakai et al.

(10) Patent No.: US 8,772,060 B2
(45) Date of Patent: Jul. 8, 2014

(54) METHOD FOR MANUFACTURING GROUP III NITRIDE SEMICONDUCTOR LIGHT EMITTING ELEMENT, GROUP III NITRIDE SEMICONDUCTOR LIGHT EMITTING ELEMENT AND LAMP

(75) Inventors: Hiromitsu Sakai, Chiba (JP); Takeshi Harada, Chiba (JP)

(73) Assignee: Toyoda Gosei Co., Ltd., Aichi (JP)

( * ) Notice: Subject to any disclaimer, the term of this patent is extended or adjusted under 35 U.S.C. 154(b) by 769 days.

(21) Appl. No.: 13/119,127

(22) PCT Filed: Sep. 14, 2009

(86) PCT No.: PCT/JP2009/004571
§ 371 (c)(1),
(2), (4) Date: Mar. 15, 2011

(87) PCT Pub. No.: WO2010/032423
PCT Pub. Date: Mar. 25, 2010

(65) Prior Publication Data
US 2011/0163349 A1    Jul. 7, 2011

(30) Foreign Application Priority Data

Sep. 16, 2008 (JP) ................................. 2008-237209

(51) Int. Cl.
  *H01L 33/30*   (2010.01)
  *H01L 33/36*   (2010.01)
  *H01L 21/02*   (2006.01)
  *H01L 33/00*   (2010.01)

(52) U.S. Cl.
  CPC ........ *H01L 21/0254* (2013.01); *H01L 21/0262* (2013.01); *H01L 21/02458* (2013.01); *H01L 33/007* (2013.01)
  USPC ................... 438/22; 438/24; 438/46; 257/88; 257/99

(58) Field of Classification Search
  CPC ............ H01L 21/0254; H01L 21/0262; H01L 21/02458; H01L 33/007
  USPC ................... 438/22–29, 46–47; 257/88–103, 257/E33.023, E33.066
  See application file for complete search history.

(56) References Cited

U.S. PATENT DOCUMENTS 7,446,045 B2 * 11/2008 Matsumoto ................... 438/691
8,492,186 B2 *  7/2013 Shinohara et al. .............. 438/44
(Continued)

FOREIGN PATENT DOCUMENTS

JP         3026087 B2   9/1990
JP         4-297023 A  10/1992
(Continued)

*Primary Examiner* — Cuong Q Nguyen
(74) *Attorney, Agent, or Firm* — Sughrue Mion, PLLC

(57) ABSTRACT

The present invention provides a method for manufacturing a group III nitride semiconductor light emitting element, with which warping can be suppressed upon the formation of respective layers on the substrate, a semiconductor layer including a light emitting layer of excellent crystallinity can be formed, and excellent light emission characteristics can be obtained; such a group III nitride semiconductor light emitting element; and a lamp. Specifically disclosed is a method for manufacturing a group III nitride semiconductor light emitting element, in which an intermediate layer, an underlayer, an n-type contact layer, an n-type cladding layer, a light emitting layer, a p-type cladding layer, and a p-type contact layer are laminated in sequence on a principal plane of a substrate, wherein a substrate having a diameter of 4 inches (100 mm) or larger, with having an amount of warping H within a range from 0.1 to 30 μm and at least a part of the edge of the substrate warping toward the principal plane at room temperature, is prepared as the substrate; the X-ray rocking curve full width at half maximum (FWHM) of the (0002) plane is 100 arcsec or less and the X-ray rocking curve FWHM of the (10-10) plane is 300 arcsec or less, in a state where the intermediate layer has been formed on the substrate and where thereafter the underlayer and the n-type contact layer are formed on the intermediate layer; and furthermore the n-type cladding layer, the light emitting layer, the p-type cladding layer, and the p-type contact layer are formed on the n-type contact layer.

13 Claims, 4 Drawing Sheets

(56) References Cited

U.S. PATENT DOCUMENTS

| | | |
|---|---|---|
| 2001/0035534 A1 | 11/2001 | Takeya et al. |
| 2003/0183157 A1 | 10/2003 | Usui et al. |
| 2012/0282443 A1* | 11/2012 | Fujito et al. .................. 428/174 |

FOREIGN PATENT DOCUMENTS

| | | |
|---|---|---|
| JP | 11-135889 A | 5/1999 |
| JP | 2000-286202 A | 10/2000 |
| JP | 2001-94150 A | 4/2001 |
| JP | 2001-196699 A | 7/2001 |
| JP | 2003-63897 A | 3/2003 |
| JP | 2003-165798 A | 6/2003 |
| JP | 2003-277195 A | 10/2003 |
| JP | 2004-168622 A | 6/2004 |
| JP | 2005-60195 A | 3/2005 |
| JP | 2006-347776 A | 12/2006 |
| JP | 2007-88193 A | 4/2007 |
| JP | 2008-205267 A | 9/2008 |

* cited by examiner

METHOD FOR MANUFACTURING GROUP III NITRIDE SEMICONDUCTOR LIGHT EMITTING ELEMENT, GROUP III NITRIDE SEMICONDUCTOR LIGHT EMITTING ELEMENT AND LAMP

CROSS REFERENCE TO RELATED APPLICATION

This application is a National Stage of International Application No. PCT/JP2009/004571 filed Sep. 14, 2009, claiming priority based on Japanese Patent Application No. 2008-237209, filed Sep. 16, 2008, the contents of all of which are incorporated herein by reference in their entirety.

TECHNICAL FIELD

The present invention relates to a method for manufacturing a group III nitride semiconductor light emitting element, a group III nitride semiconductor light emitting element produced by this method, and a lamp using the same.

Priority is claimed on Japanese Patent Application No. 2008-237209, filed Sep. 16, 2008, the content of which is incorporated herein by reference.

BACKGROUND ART

Group III nitride semiconductors have a direct transition-type band-gap in an energy range from visible light to ultraviolet light and exhibit an excellent light emission efficiency, and thus group III nitride semiconductors have been manufactured as semiconductor light emitting elements such as a light emitting diode (LED) and a laser diode (LD) for use in various applications. Even when used in an electronic device, group III nitride semiconductors have a potential to provide better properties than cases where conventional types of group III-V compound semiconductors are used.

Such group III nitride semiconductors are, in general, produced from trimethyl gallium, trimethyl aluminum, and ammonia, as raw materials by a Metal Organic Chemical Vapor Deposition (MOCVD) method. MOCVD method is a method in which a carrier gas containing a vapor of a raw material is conveyed to the surface of a substrate, and the raw material is decomposed on the surface of the heated substrate, to thereby grow a crystal.

In the past, a single crystal wafer of a group III nitride semiconductor has not been commercially available, and it has been usual to produce a group III nitride semiconductor by a method of growing a crystal on a single crystal wafer made of a different kind of material. There is a large lattice mismatch between such a different kind of substrate and a group III nitride semiconductor crystal epitaxially grown thereon. For example, when gallium nitride (GaN) is grown on a sapphire ($Al_2O_3$) substrate, there is a lattice mismatch of 16% therebetween, and when gallium nitride is grown on a SiC substrate, there is a lattice mismatch of 6% therebetween. In general, if there is such a large lattice mismatch, there is a problem in that it would be difficult to epitaxially grow the crystal directly on the substrate, and even if it is grown, it would be impossible to obtain a crystal having an excellent crystallinity.

Therefore, when epitaxially growing a group III nitride semiconductor crystal on a single crystal sapphire substrate or a single crystal SiC substrate by a Metal Organic Chemical Vapor Deposition (MOCVD) method, a method has been proposed and generally employed that a layer called a low temperature buffer layer made of aluminum nitride (AlN) or aluminum gallium nitride (AlGaN) is firstly laminated on a substrate, and then a group III nitride semiconductor crystal is epitaxially grown thereon at high temperature (for example, refer to Patent Documents 1 and 2).

Other method has also been proposed that a buffer layer is previously formed on a substrate by a sputtering method, the substrate having this buffer layer formed thereon is placed in an MOCVD reacting furnace, and then a group III nitride semiconductor layer is formed thereon (for example, Patent Documents 3 and 4).

According to light emitting elements comprising the group III nitride semiconductors as described in Patent Documents 1 to 4, employing the above-mentioned structure, the occurrence of lattice mismatch between the substrate and the group III nitride semiconductor crystal can be avoided and therefore semiconductor layers of excellent crystallinity can be formed.

In addition, when a semiconductor substrate (wafer) is formed by laminating an underlayer, for example, by using an MOCVD method or the like, on the intermediate layer that has been formed on the substrate using a conventional method as described in Patent Documents 1 to 4 or the like, the entire semiconductor substrate is exposed to high temperature during the formation of the underlayer. Here, as shown in FIG. 5A and FIG. 5B, because the coefficients of thermal expansion are different between the sapphire constituting the substrate 111, and the group III nitride semiconductor such as GaN, the substrate 111 warps typically in such a way that the substrate edge 111b goes to the opposite side of the laminated surface 111a of the substrate 111, and as a result the entire semiconductor substrate is largely warped. If a light emitting element is produced by laminating a semiconductor layer composed of a group III nitride semiconductor on such a largely warped semiconductor substrate, troubles may occur particularly during the exposure in the photolithographic process, the process to grind the backside of the substrate, or the like. For example, if the substrate is largely warped during the exposure by using a photolithographic method, the distance between the photomask and the resist becomes uneven in the substrate plane, and the dimensions of the photomask and the substrate are mismatched in the substrate plane, and as a result, there is a problem that the mask alignment can not be precisely done in the entire substrate plane. Moreover, for cleaving the substrate to divide it into light emitting element chip units, it is necessary to grind the backside of the substrate to be thin. However, if the substrate is largely warped, there is a problem that the substrate may be broken during the grinding process. Furthermore, if the substrate is largely warped at the time of lamination of a semiconductor layer composed of a group III nitride semiconductor, there is a problem that the crystallinity and therefore the light emission characteristics may be deteriorated, because the temperature distribution becomes uneven in the plane, and thus the film thickness and the composition of each layer may become uneven.

In order to suppress such warping of the semiconductor substrate and the light emitting element, a technique has been proposed in which the amount of warping of the substrate is defined within a predetermined range, and a thin epitaxial layer (group III nitride compound: underlayer) is formed on the substrate via an intermediate layer (for example, refer to Patent Document 5). According to the technique described in Patent Document 5, the amount of warping of the substrate is set within a predetermined range, and the underlayer formed thereon is made thin. As a result, the warping of the wafer including the substrate can be suppressed even if the substrate is exposed to high temperature during the process of forming a semiconductor layer on the underlayer.

However, if the underlayer formed on the substrate is made thin as in Patent Document 5, there is a big problem that the crystallinity of the light emitting layer provided on the semiconductor layer formed thereon is deteriorated, and therefore the light emission output power is also lowered and the emission wavelength becomes uneven.

PRIOR ART DOCUMENTS

Patent Documents

Patent Document 1: Japanese Patent Publication No. 3026087
Patent Document 2: Japanese Unexamined Patent Application, First Publication No. H04-297023
Patent Document 3: Japanese Patent Publication No. 3440873
Patent Document 4: Japanese Patent Publication No. 3700492
Patent Document 5: Japanese Unexamined Patent Application, First Publication No. 2003-63897

DISCLOSURE OF INVENTION

Problems to be Solved by the Invention

The present invention takes the above-mentioned problems into consideration with an object of providing a method for manufacturing a group III nitride semiconductor light emitting element, whereby warping of a substrate being subjected to epitaxial growth can be suppressed after the formation of an intermediate layer, an underlayer, and an n-type contact layer on the substrate, the emission wavelength distribution (σ) can be small, a semiconductor layer including a light emitting layer of excellent crystallinity can be formed, and excellent light emission characteristics can be obtained, and a group III nitride semiconductor light emitting element produced by this method.

Another object of the present invention is to provide a lamp using the above-mentioned group III nitride semiconductor light emitting element.

Means to Solve the Problems

The inventors of the present invention conducted intensive studies to solve the above-mentioned problems. As a result, they found out that if an intermediate layer, an underlayer, and an n-type contact layer are laminated on a substrate which has been previously set to have a predetermined amount of warping, and furthermore if the X-ray rocking curve half widths after forming the underlayer and the n-type contact layer on the intermediate layer are defined to control the crystallinity, the amount of warping can be as reduced as much as possible upon the formation of a semiconductor layer including a light emitting layer thereon, and furthermore improved crystallinity of the semiconductor layer, excellent emission intensity, and stable emission wavelength can be obtained. This had led to the completion of the present invention.

That is, the present invention relates to the following.

[1] A method for manufacturing a group III nitride semiconductor light emitting element, in which an intermediate layer, an underlayer, an n-type contact layer, an n-type cladding layer, a light emitting layer, a p-type cladding layer, and a p-type contact layer are laminated in sequence on a principal plane of a substrate, wherein a substrate having a diameter of 4 inches (100 mm) or larger, with at least a part of the edge of the substrate having an amount of warping H within a range from 0.1 to 30 μm in the direction of warping toward the principal plane at room temperature, is prepared as the substrate; a X-ray rocking curve half width of a (0002) plane is 100 arcsec or less and a X-ray rocking curve half width of a (10-10) plane is 300 arcsec or less, in a state where the intermediate layer has been formed on the substrate and thereafter the underlayer and the n-type contact layer are formed on the intermediate layer; and furthermore the n-type cladding layer, the light emitting layer, the p-type cladding layer, and the p-type contact layer are formed on the n-type contact layer.

[2] The method for manufacturing a group III nitride semiconductor light emitting element according to [1], wherein the X-ray rocking curve half width of the (0002) plane is 50 arcsec or less and the X-ray rocking curve half width of the (10-10) plane is 250 arcsec or less, in a state where the underlayer and the n-type contact layer are formed on the intermediate layer.

[3] The method for manufacturing a group III nitride semiconductor light emitting element according to [1] or [2], wherein the substrate is a sapphire substrate, and the intermediate layer is formed on a c-plane of the sapphire substrate.

[4] The method for manufacturing a group III nitride semiconductor light emitting element according to any one of [1] to [3], wherein the intermediate layer is formed from $Al_XGa_{1-X}N$ ($0 \leq X \leq 1$).

[5] The method for manufacturing a group III nitride semiconductor light emitting element according to [4], wherein the intermediate layer is formed from AlN.

[6] The method for manufacturing a group III nitride semiconductor light emitting element according to any one of [1] to [5], wherein the intermediate layer is formed by a sputtering method.

[7] The method for manufacturing a group III nitride semiconductor light emitting element according to any one of [1] to [6], wherein the underlayer is formed from AlGaN.

[8] The method for manufacturing a group III nitride semiconductor light emitting element according to any one of [1] to [6], wherein the underlayer is formed from GaN.

[9] The method for manufacturing a group III nitride semiconductor light emitting element according to any one of [1] to [8], wherein the underlayer is formed by an MOCVD method.

[10] The method for manufacturing a group III nitride semiconductor light emitting element according to any one of [1] to [8], wherein the underlayer is formed by a sputtering method.

[11] The method for manufacturing a group III nitride semiconductor light emitting element according to any one of [1] to [10], wherein a total thickness of the intermediate layer, the underlayer, and the n-type contact layer is set to 8 μm or larger.

[12] A group III nitride semiconductor light emitting element produced by the manufacturing method according to any one of [1] to [11].

[13] A lamp comprising the group III nitride semiconductor light emitting element according to [12].

The method for manufacturing a group III nitride semiconductor light emitting element of the present invention is a method wherein a substrate having a diameter of 4 inches (100 mm) or larger, with at least a part of the edge of the substrate having an amount of warping H within a range from 0.1 to 30 μm in the direction of warping toward the principal plane, is prepared; the X-ray rocking curve half width of the (0002) plane is 100 arcsec or less and the X-ray rocking curve half width of the (10-10) plane is 300 arcsec or less, in a state where an intermediate layer has been formed on this substrate and thereafter an underlayer and an n-type contact layer are formed on the intermediate layer; and furthermore an n-type cladding layer, a light emitting layer, a p-type cladding layer, and a p-type contact layer are formed on this n-type contact layer. Therefore, warping can be as suppressed as much as possible after the formation of the intermediate layer, the underlayer, and the n-type contact layer on the substrate, and a semiconductor layer including a light emitting layer of excellent crystallinity can be formed thereon. As a result, a group III nitride semiconductor light emitting element with excellent emission intensity and stable emission wavelength can be obtained.

Furthermore, the lamp of the present invention uses the group III nitride semiconductor light emitting element of the present invention mentioned above, and therefore has excellent light emission characteristics.

BEST MODE FOR CARRYING OUT THE INVENTION

Hereunder is a description of one embodiment of the method for manufacturing a group III nitride semiconductor light emitting element, the group III nitride semiconductor light emitting element, and the lamp, according to the present invention, with appropriate reference to the drawings.

[Group III Nitride Semiconductor Light Emitting Element]

Figure 1:
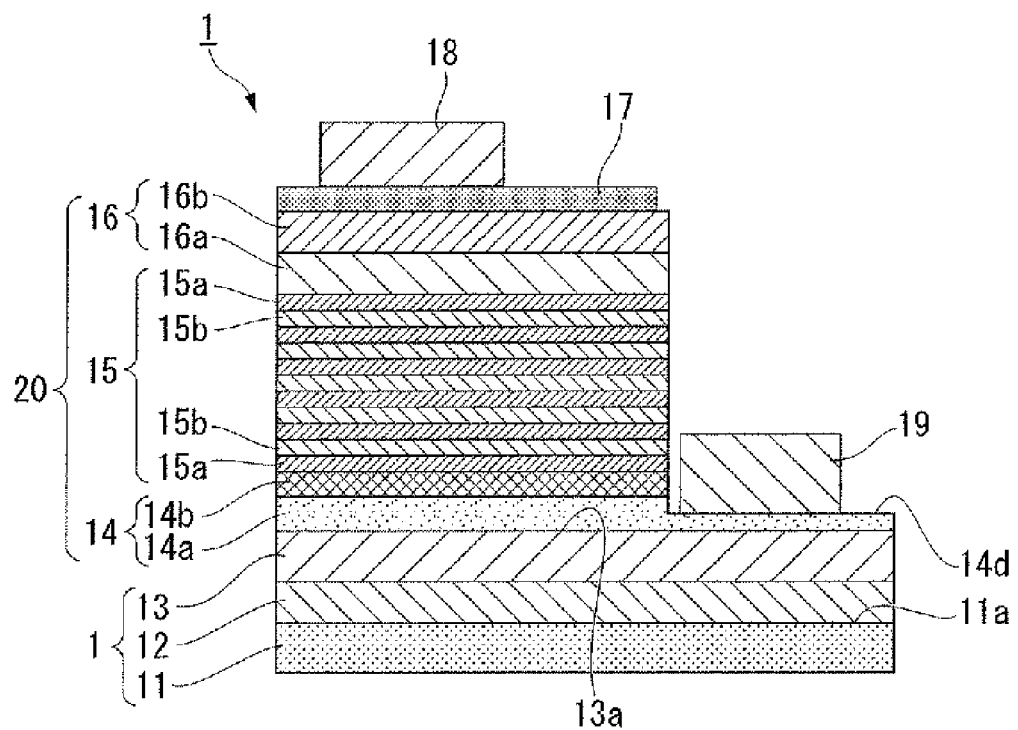
FIG. 1 is a diagram schematically illustrating an example of the group III nitride semiconductor light emitting element according to the present invention, in a cross-sectional view showing the lamination structure.
Figure 2:
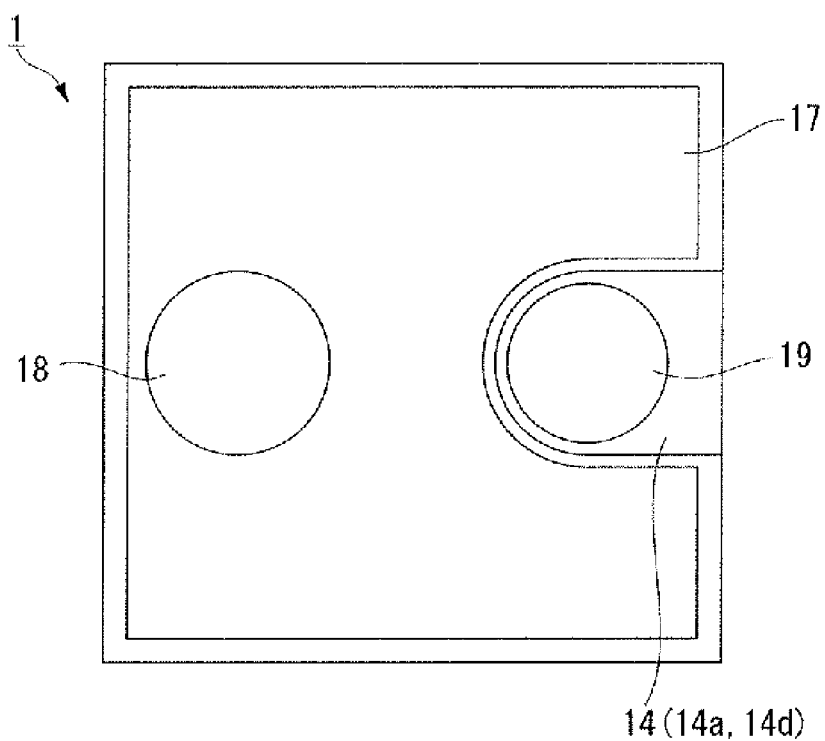
FIG. 2 is a diagram schematically illustrating the example of the group III nitride semiconductor light emitting element according to the present invention, in a plan view of the group III nitride semiconductor light emitting element of FIG. 1.

FIG. 1 is a cross-sectional view schematically illustrating an example of the group III nitride semiconductor light emitting element according to the present invention (hereafter, may be abbreviated as "light emitting element"). FIG. 2 is a plan view of the light emitting element 1 of FIG. 1.

As shown in FIG. 1, the light emitting element 1 of this embodiment is a type of element in which electrodes are held in one plane, and roughly comprises a structure in which an intermediate layer 12, an underlayer 13, an n-type semiconductor layer 14, a light emitting layer 15, and a p-type semiconductor layer 16 are laminated in sequence on a principal plane 11a of a substrate 11.

Hereunder is a detailed description of the structure of the light emitting element 1 of this embodiment.
<Substrate>

As the material which can be used for the substrate 11 in the light emitting element 1 of this embodiment, it is possible to employ any substrate material on the surface of which a group III nitride semiconductor crystal can epitaxially grow, by selecting from various materials without any particular limitation. Examples thereof include sapphire, SiC, silicon, zinc oxide, magnesium oxide, manganese oxide, zirconium oxide, manganese zinc iron oxide, magnesium aluminum oxide, zirconium borate, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, and molybdenum.

Of these substrate materials, it is particularly preferable to use sapphire. It is desirable to form the intermediate layer 12, details of which will be explained later, on a c-plane of the sapphire substrate, that is, the principal plane 11a of the substrate 11 in this embodiment. Moreover, in cases where sapphire is used, it is preferable for the substrate to have an off-axis angle of 0.1 to 0.7 degrees, and more desirably an off-axis angle of 0.2 to 0.4 degrees.

Among the above-mentioned substrate materials, in cases where some oxide substrates and metal substrates and the like, which are known to cause a chemical decomposition when contacted with ammonia at high temperature, is used to form the intermediate layer 12 without using ammonia, and to form an underlayer 13, which will be described later, by a method using ammonia, the intermediate layer 12 can act as a coat layer so that it is effective to prevent such a chemical denaturation of the substrate 11.

Moreover, in general, since the temperature of the substrate 11 can be kept low with a sputtering method, even if the substrate 11 made of a material decomposable at high temperatures is used, each layer can be formed on the substrate without damaging the substrate 11.

In this embodiment, as will be described in the manufacturing method later, upon the formation of the intermediate layer 12 and the underlayer 13 on the principal plane 11a of the substrate 11, it is necessary to previously adjust the substrate 11 in a warped state such that at least a part of the substrate edge 11b has a predetermined amount of warping in the direction toward the principal plane 11a (refer to FIG. 3A). The amount of warping H previously given to the substrate 11 in such a manner is preferably within a range from 0.1 to 30 μm, in cases where a substrate having a diameter of 4 inches (100 mm) or larger is used. If the amount of warping H of the substrate 11 is previously set within this range, the amount of warping of the substrate 11 can be set to approximately 0 (zero) μm upon the formation of a semiconductor layer 20 including a light emitting layer 15 which will be described later, so that the warping can be kept to a minimum.

Moreover, even if the amount of warping H of the substrate 11 has been previously set within the above-mentioned range, the amount of warping of the substrate 11 after the formation of the semiconductor layer 20 on the principal plane 11a of the substrate may still be influenced by the thickness of the substrate 11. Thus, in the present invention, it is preferable to select the thickness of the substrate within a range from 0.4 mm to 1.5 mm.

Furthermore, it is preferable that the substrate to be used has a diameter of 4 inches (100 mm) or larger, preferably within a range from 4 inches (100 mm) to 8 inches (210 mm), and more preferably within a range from 4 inches (100 mm) to 6 inches (155 mm), in addition to the thickness of the substrate being within a range from 0.4 mm to 1.5 mm.

If the thickness of the substrate 11 is less than 0.4 mm, the influence of the difference in the coefficient of thermal expansion between the substrate 11 and the semiconductor layer 20 is so large that the substrate 11 would be largely warped after the formation of the semiconductor layer 20. As a result, the emission wavelength from the light emitting layer 15 formed on the substrate 11 would be largely distributed. On the other hand, if the thickness of the substrate 11 exceeds 1.5 mm, the unit price of the substrate would increase and the production cost would be incremented, although the substrate 11 has no problem regarding the warping of the substrate 11 during the formation of the semiconductor layer 20 as mentioned above.

In this description, the standard deviation σ (nm) of wavelengths of light emitted from the substrate 11 (compound semiconductor wafer), on which the semiconductor layer 20 including the light emitting layer 15 has been formed, is referred to as the "wavelength distribution σ". In particular, according to the method for manufacturing a semiconductor light emitting element of the present invention, the wavelength distribution σ can be made 6 nm or smaller, and preferably 5 nm or smaller. The measurement of the wavelength distribution σ of the compound semiconductor wafer is not limited in the present invention as will be described later, although it is preferable to carry out the measurement by using a PL mapper (manufactured by ACCENT: RPM-Σ).

<Intermediate Layer>

In the light emitting element 1 of this embodiment, the intermediate layer 12 having a hexagonal crystal structure is formed on the substrate 11.

The intermediate layer 12 is formed with a purpose of protecting the substrate 11 from chemical reactions at high temperature, a purpose of alleviating the difference in the lattice constant between the materials of the substrate 11 and the semiconductor layer 20, or a purpose of promoting the nucleation for the crystal growth.

As the material of the intermediate layer 12, a Ga-containing group III nitride semiconductor crystal is preferably used. In particular, the material is preferably composed of $Al_xGa_{1-x}N$ ($0 \leq X \leq 1$, preferably $0.5 \leq X \leq 1$, and more preferably $0.9 \leq X \leq 1$). Of the above-mentioned composition, preferred is AlN.

Moreover, the intermediate layer 12 may be composed of polycrystals of $Al_xGa_{1-x}N$ ($0 \leq X \leq 1$), although it is more preferable that the intermediate layer 12 is composed of a single crystal of $Al_xGa_{1-x}N$ ($0 \leq X \leq 1$).

The crystal of the group III nitride semiconductor grows not only upward but also in the in-plane direction by controlling the growth condition, and thereby a single crystal structure can be formed. Therefore, the intermediate layer 12 composed of a single crystal structure of a group III nitride semiconductor can be made by controlling the film formation condition of the intermediate layer 12.

In cases where the intermediate layer 12 having such a single crystal structure is formed on the substrate 11, the function of the intermediate layer 12 as a buffer can work effectively. Therefore, the layer of the group III nitride semiconductor to be formed thereon will be of a crystal film having excellent orientation and crystallinity.

Moreover, the crystal of the group III nitride semiconductor constituting the intermediate layer 12 can also be of columnar crystals (polycrystals) in an aggregate structure based on hexagonal columns, by controlling the film formation condition as mentioned above. The term "columnar crystals in an aggregate structure" used herein refers to crystals arranged such that adjacent crystal grains are separated since crystal grain boundaries are formed therebetween and each crystal per se has a columnar shape when cut in a longitudinal section.

Furthermore, it is necessary to cover at least 60% or greater, and preferably 80% or greater, and more preferably 90% or greater of the surface 11a of the substrate 11, by the intermediate layer 12. It is most preferable to cover 100% of the surface 11a, that is, to thoroughly cover the entire surface 11a of the substrate 11 by the intermediate layer 12.

If the area of the surface 11a of the substrate 11 covered by the intermediate layer 12 is small, the substrate 11 becomes largely exposed. In this case, the underlayer 13 formed on the intermediate layer 12 and the underlayer 13 formed directly on the substrate 11 have different lattice constants, and as a result the crystal may become uneven, or hillocks and pits may be generated.

In addition, it is possible for the intermediate layer 12 to cover not only the surface 11a but also the side faces of the substrate 11, and furthermore, the backside of the substrate 11.

<Underlayer>

The underlayer 13 of this embodiment is composed of a group III nitride semiconductor. The material of the underlayer 13 may be either the same as or different from the material of the intermediate layer 12, although it is preferable to use a Ga-containing group III nitride semiconductor, that is to say, a GaN-based compound semiconductor, because dislocation loops can easily occur therein. It is more preferable that the underlayer 13 is composed of an $Al_xGa_{1-x}N$ layer ($0 \leq X \leq 1$, preferably $0 \leq X \leq 0.5$, and more preferably $0 \leq X \leq 0.1$). Moreover, experiments conducted by the inventors of the present invention showed that a Ga-containing group III nitride, in particular, AlGaN was suitable as the material of the underlayer 13, and also GaN was suitable, too.

In this embodiment, the thickness of the underlayer 13 is not specifically limited, although it is preferably within a range from 0.1 μm to 20 μm, and more preferably from 0.5 μm to 15 μm. If the intermediate layer 12 is composed of an aggregate of columnar crystals (polycrystals) with distinct crystal grain boundaries, it is necessary to make dislocation loops through migration so that the underlayer 13 would not directly take over the crystallinity of the intermediate layer 12. However, if the thickness of the underlayer 13 is less than 0.5 μm, dislocation loops may not be sufficient. In addition, it is not preferable to set the thickness of the underlayer 13 more than 20 μm, because the time for forming the film is extended although the function remains unchanged.

The underlayer 13 may be either doped with an n-type impurity within a range from $1 \times 10^{17}$ to $1 \times 10^{19}/cm^3$ if necessary, or left undoped ($<1 \times 10^{17}/cm^3$), although it is preferable to leave it undoped since excellent crystallinity can be maintained.

For example, in cases where the substrate 11 has conductivity, the underlayer 13 can be conductive by doping with a dopant and thereby electrodes can be formed above and below the semiconductor layer. As a result, a light emitting element of a top-bottom electrode structure can be formed. On the other hand, in cases where an insulating material is used as the substrate 11, a chip structure will be taken in which respective electrodes, that is, positive and negative electrodes, are provided on the same plane side of the light emitting element 1. Therefore, the underlayer 13 laminated right above the substrate 11 via the intermediate layer 12 is preferably an undoped crystal since excellent crystallinity can be obtained.

The n-type impurity is not specifically limited, and can be exemplified by Si, Ge, Sn, or the like. Preferred examples are Si and Ge.

In this embodiment, it is preferable that the X-ray rocking curve (XRC) half width of the (0002) plane is 100 arcsec or less and the XRC half width of the (10-10) plane is 300 arcsec or less, in a state where the underlayer 13 and the n-type contact layer 14a that will be described later are formed on the intermediate layer 12. Moreover, more preferred XRC half widths are that the XRC half width of the (0002) plane is 50 arcsec or less and the XRC half width of the (10-10) plane is 250 arcsec or less.

In this embodiment, as will be described in detail later, by defining the amount of warping of the substrate 11 to be within a predetermined range, and furthermore by controlling the XRC half widths of the underlayer 13 within the abovementioned ranges, it becomes possible to minimize the amount of warping to approximately 0 (zero) μm after each layer has been formed on the substrate 11, and to form a semiconductor layer 20 consisting of a group III nitride semiconductor of excellent crystallinity on the surface 13a of the underlayer 13.

The term "X-ray rocking curve (XRC) half width" used in the present invention means a half width of an X-ray diffraction rocking curve. This XRC half width can be measured with an X-ray generator, for example, operated at an output of 45 kV and an electrical current of 40 mA, in which a double diffraction Ge hybrid monochromator was provided as the monochromator in the incident optical system, and the divergent beam from the X-ray tube was converted to a monochromatic parallel beam. Moreover, as the receiving optical system, it is possible to use a triple axis module with a resolution of 12" was used, and to use a proportional counter as the X-ray detector. Furthermore, the measurement can be conducted under the condition where a ⅛" slit was used as the divergence slit on the X-ray generator side, and the X-ray beam diameter was focused down to dimensions of height: 10 mm×width: 0.365 mm.

The light emitting element can be constructed by laminating the semiconductor layer 20, that will be described later, on the underlayer 13 consisting of a group III nitride semiconductor. Upon the formation of the semiconductor layer for the light emitting element in this manner, it is possible to form the layer by laminating, for example an n-type conductive layer doped with an n-type dopant such as Si, Ge, and Sn, a p-type conductive layer doped with a p-type dopant such as Mg, and such layers. In addition, as the material, InGaN can be used for the light emitting layer and such layers, while AlGaN can be used for the cladding layer and such layers. In this way, it becomes possible, by forming group III nitride semiconductor crystal layers having additional functions on the underlayer 13, to produce a wafer of a semiconductor lamination structure that can be used for the production of a light emitting diode, a laser diode, an electronic device, or such devices.

<Semiconductor Layer>

As shown in FIG. 1, the semiconductor layer 20 is formed on the intermediate layer 12 and the underlayer 13 which have been formed on the substrate 11, and comprises an n-type semiconductor layer 14, a light emitting layer 15, and a p-type semiconductor layer 16 in this order from the underlayer 13 side.

(n-type Semiconductor Layer)

The n-type semiconductor layer 14 is laminated on the underlayer 13, and comprises an n-type contact layer 14a and an n-type cladding layer 14b.

Here, it is either possible that the n-type contact layer has both functions as an underlayer and/or an n-type cladding layer, or that the underlayer 13 has both functions as an n-type contact layer and/or an n-type cladding layer.

n-type Contact Layer

The n-type contact layer 14a consists of a group III nitride semiconductor, and is preferably composed of an $Al_XGa_{1-X}N$ layer ($0 \leq X \leq 1$, preferably $0 \leq X \leq 0.5$, and more preferably $0 \leq X \leq 0.1$) similarly to the underlayer 13 mentioned above.

In addition, the n-type contact layer 14a is preferably doped with an n-type impurity. It is preferable to dope the n-type impurity at a concentration from $1 \times 10^{17}$ to $1 \times 10^{19}$/cm$^3$, and preferably from $1 \times 10^{18}$ to $1 \times 10^{19}$/cm$^3$, because excellent ohmic contact with the negative electrode can be maintained, cracking can be prevented, and excellent crystallinity can be maintained. The n-type impurity is not specifically limited, and can be exemplified by Si, Ge, Sn, or the like. Preferred examples thereof are Si and Ge.

It is preferable that the group III nitride semiconductors constituting the underlayer 13 and the n-type contact layer 14a have the same composition. It is also preferable that the total thickness of the underlayer 13 and the n-type contact layer 14a is set within a range from 0.1 to 20 μm, preferably from 0.5 to 15 μm, and more preferably from 1 to 12 μm. If the thickness is within this range, excellent crystallinity of the semiconductor can be maintained.

n-type Cladding Layer

It is preferable to provide an n-type cladding layer 14b between the n-type contact layer 14a and the light emitting layer 15 that will be described later. By providing the n-type cladding layer 14b, effects such as supply of electrons to the active layer (light emitting layer 15) and alleviation of the difference in the lattice constant can be achieved.

The n-type cladding layer 14b can be formed of AlGaN, GaN, GaInN, or the like. Moreover, the n-type cladding layer 14b may be either a heterojunction of these structures or a superlattice structure formed by laminating a plurality of layers. In the case where the n-type cladding layer 14b is formed of GaInN, needless to say, it is desirable that the band gap is larger than the band gap of the GaInN of the light emitting layer 15.

The concentration of the n-type dopant in the n-type cladding layer 14b is preferably within a range from $1 \times 10^{17}$ to $1 \times 10^{20}$/cm$^3$, and more preferably a range from $1 \times 10^{18}$ to $1 \times 10^{19}$/cm$^3$. The dopant concentration is preferably within this range because excellent crystallinity can be maintained and the voltage to operate the light emitting element can be lowered.

In those cases where the n-type cladding layer 14b incorporates a superlattice structure, although not shown in detail in the drawings, the layer may include a laminated structure composed of an n-side first layer formed of a group-III nitride compound semiconductor having a film thickness of not more than 100 angstroms, and an n-side second layer having a different composition from the n-side first layer and formed of a group-III nitride compound semiconductor having a film thickness of not more than 100 angstroms. Further, the n-type cladding layer 14b may also include a structure in which the n-side first layer and the n-side second layer are laminated repeatedly in an alternating arrangement. Furthermore, a structure in which either the n-side first layer or the n-side second layer contacts the active layer that will be described later is preferred.

The above-mentioned n-side first layer and n-side second layer can be formed, for example, using an AlGaN system containing Al (hereafter also referred to as simply "AlGaN"), a GaInN system containing In (hereafter also referred to as simply "GaInN"), or GaN. Further, the n-side first layer and the n-side second layer may also be a GaInN/GaN alternating structure, an AlGaN/GaN alternating structure, a GaInN/AlGaN alternating structure, a GaInN/GaInN alternating structure having a different composition for each layer (in the present invention, the expression "different composition" refers to a different compositional ratio for each of the component elements, this definition also applies below), or an AlGaN/AlGaN alternating structure having a different composition for each layer. In the present invention, the n-side first layer and the n-side second layer preferably have either a GaInN/GaN alternating structure, or a GaInN/GaInN alternating structure having a different composition for each layer.

The superlattice layers of the n-side first layer and the n-side second layer are preferably not more than 60 angstroms in each case, are more preferably 40 angstroms or less, and are most preferably within a range from 10 to 40 angstroms. If the film thickness of the n-side first layer and n-side second layer that form the superlattice layer exceed 100 angstroms, then crystal defects become more prevalent.

The n-side first layer and the n-side second layer may be doped structures, or may be a combination of a doped structure and an undoped structure. As the doping impurity, any of the conventional impurities used for doping the above material compositions can be used without any particular limitations. For example, in those cases where a GaInN/GaN alternating structure or a GaInN/GaInN alternating structure having a different composition for each layer is used as the n-type cladding layer, Si is preferred as the impurity. Further, the above-mentioned n-type superlattice multilayer film may be prepared with doping switched appropriately ON and OFF, even if the composition such as GaInN, AlGaN or GaN is the same.

(Light Emitting Layer)

The light emitting layer 15 is an active layer which is laminated on the n-type semiconductor layer 14, and on which the p-type semiconductor layer 16 is laminated. The light emitting layer 15 can adopt structures such as a multiple quantum well structure, a single quantum well structure and a bulk structure. In this embodiment, as shown in FIG. 1, the light emitting layer 15 has a structure in which barrier layers 15a consisting of a group III nitride semiconductor, and well layers 15b consisting of an indium-containing group III nitride semiconductor, are laminated alternately and repeatedly, and also the barrier layers 15a are arranged at both sides of the n-type semiconductor layer 14 and the p-type semiconductor layer 16. In the example shown in FIG. 1, the light emitting layer 15 has a multiquantum well structure in which six barrier layers 15a and five well layers 15b are laminated alternately and repeatedly, barrier layers 15a are arranged as the uppermost and lowermost layers of the light emitting layer 15, and a well layer 15b is positioned between each pair of barrier layers 15a.

As the barrier layer 15a, for example, a gallium nitride-based compound semiconductor such as $Al_cGa_{1-c}N$ ($0 \leq c \leq 0.3$) having a larger band gap energy than the well layer 15b can be preferably used.

In addition, as the well layer 15b, for example, a gallium indium nitride such as $Ga_{1-s}In_sN$ ($0 < s < 0.4$) can be used as a gallium nitride-based compound semiconductor that contains indium.

The light emitting element 1 of this embodiment comprises the intermediate layer 12 and the underlayer 13 formed on the substrate 11, the amount of warping H of which has been defined in the above-mentioned manner, and the semiconductor layer 20 formed thereon. Thus, even if a growth temperature of about 750° C. is applied during the formation of the light emitting layer 15, the substrate 11 and each layer can be prevented from warping, and the growth surface can be kept flat. By so doing, the light emitting layer 15 becomes a layer having excellent crystallinity and uniformity, and therefore high emission intensity and stable emission wavelength can be obtained.

(p-type Semiconductor Layer)

As shown in FIG. 1, the p-type semiconductor layer 16 comprises a p-type cladding layer 16a and a p-type contact layer 16b, although it is possible that the p-type contact layer also functions as a p-type cladding layer, for example.

p-type Cladding Layer

Although there are no particular limitations on the p-type cladding layer 16a, provided it has a composition that exhibits a larger band gap energy than that of the light emitting layer 15 and is capable of confining a carrier in the light-emitting layer 15, examples of preferred layers include those formed of $Al_dGa_{1-d}N$ (wherein $0 < d \leq 0.4$, and preferably $0.1 \leq d \leq 0.3$). A p-type cladding layer 16a composed of this type of AlGaN is preferred in terms of confining a carrier in the light-emitting layer 15.

The p-type dopant concentration in the p-type cladding layer 16a is preferably within a range from $1 \times 10^{18}$ to $1 \times 10^{21}$/cm$^3$, and more preferably from $1 \times 10^{19}$ to $1 \times 10^{20}$/cm$^3$. If the p-type dopant concentration is within this range, an excellent p-type crystal can be produced without deteriorating the crystallinity. Although there are no particular limitations on the p-type impurity, for example, Mg or the like can be suitably used.

The p-type cladding layer 16a may also be formed as a superlattice structure having a plurality of laminated layers. In those cases where the p-type cladding layer 16a incorporates a superlattice structure, although not shown in detail in the drawings, the layer may include a laminated structure composed of a p-side first layer formed of a group III nitride semiconductor having a film thickness of not more than 100 angstroms, and a p-side second layer having a different composition from the p-side first layer and formed of a group III nitride semiconductor having a film thickness of not more than 100 angstroms. Further, the p-type cladding layer 16a may also include a structure in which the p-side first layer and the p-side second layer are laminated repeatedly in an alternating arrangement.

The above-mentioned p-side first layer and p-side second layer can be formed, for example, from any one of AlGaN, GaInN and GaN, with a different composition for each layer. Further, the p-side first layer and p-side second layer may also be formed as a GaInN/GaN alternating structure, an AlGaN/GaN alternating structure, or a GaInN/AlGaN alternating structure. In the present invention, the p-side first layer and the p-side second layer preferably have either a AlGaN/AlGaN structure, or an AlGaN/GaN alternating structure.

The superlattice layers of the p-side first layer and the p-side second layer are preferably not more than 60 angstroms in each case, are more preferably 40 angstroms or less, and are most preferably within a range from 10 to 40 angstroms. If the film thickness of the p-side first layer and p-side second layer that form the superlattice layer exceed 100 angstroms, then the layer tends to contain many crystal defects, which is undesirable.

The p-side first layer an the p-side second layer may be doped structures, or may be a combination of a doped structure and an undoped structure. As the doping impurity, any of the conventional impurities used for doping the above material compositions can be used without any particular limitations. For example, in those cases where an AlGaN/GaN alternating structure or an AlGaN/AlGaN alternating structure having a different composition for each layer is used as the p-type cladding layer, Mg is preferred as the impurity.

Further, the above-mentioned p-type superlattice multilayer film may be prepared with doping switched appropriately ON and OFF, even if the composition such as GaInN, AlGaN or GaN is the same.

p-type Contact Layer

The p-type contact layer 16b is a group III nitride semiconductor layer including at least $Al_eGa_{1-e}N$ ($0 \le e < 0.5$, preferably $0 \le e \le 0.2$, and more preferably $0 \le e \le 0.1$). The Al composition is preferably within the above-mentioned range because excellent crystallinity can be maintained and excellent ohmic contact with the p-ohmic electrode (refer to a translucent electrode 17 that will be described later) can be obtained.

In addition, the p-type contact layer 16b preferably contains a p-type dopant at a concentration within a range from $1 \times 10^{18}$ to $1 \times 10^{21}/cm^3$, because excellent ohmic contact can be maintained, cracking can be prevented, and excellent crystallinity can be maintained. The p-dopant concentration is more preferably from $5 \times 10^{19}$ to $5 \times 10^{20}/cm^3$. There are no particular limitations on the p-type impurity, for example, Mg or the like can be suitably used.

The semiconductor layer 20 constructing the light emitting element 1 of the present invention is not limited to the above-mentioned embodiment.

For example, as the material of the semiconductor layer constructing the present invention, there are other known materials other than the above-mentioned materials, such as gallium nitride-based compound semiconductors represented by the general formula $Al_XGa_YIn_ZN_{1-A}M_A$ ($0 \le X \le 1$, $0 \le Y \le 1$, $0 \le Z \le 1$, and $X+Y+Z=1$. The symbol M represents a group V element other than nitrogen (N), and $0 \le A < 1$). In this invention, these known gallium nitride-based compound semiconductors can be used without specific limitations.

In addition, the group III nitride semiconductor containing Ga as the group III element may also contain any other group III elements differing from Al, Ga and In, and if necessary, may also contain an element such as Ge, Si, Mg, Ca, Zn, Be, P, As, and B. Furthermore, the semiconductor may contain not only elements that have been intentionally added, but also impurities that are unavoidably contained as a result of the film formation conditions, and very small quantities of impurities coming from raw materials or reaction tube materials.

<Translucent Positive Electrode>

The translucent positive electrode 17 is a translucent electrode to be formed on the p-type semiconductor layer 16.

The material of the translucent positive electrode 17 is not specifically limited, and materials such as ITO ($In_2O_3$—$SnO_2$), AZO (ZnO—$Al_2O_3$), IZO ($In_2O_3$—ZnO), and GZO (ZnO—$Ga_2O_3$) can be used. In addition, the translucent positive electrode 17 can adopt any structure, including conventionally well known structures without any limitation.

Further, the translucent positive electrode 17 may be formed so as to cover the entire surface of the p-type semiconductor layer 16, or may be formed in a lattice shape or branched shape with gaps therein.

<Positive Electrode>

A positive electrode 18 is a substantially circular electrode formed on the transparent positive electrode 17, as shown in FIG. 2.

As the material for the positive electrode 18, various structures using Au, Al, Ni and Cu are well known, and any of these known materials or structures may be used without any limitations.

The thickness of the positive electrode 18 is preferably within a range from 100 to 1,000 nm. Further, in terms of a bonding pad properties, a larger thickness yields superior bondability, and therefore the thickness of the positive electrode bonding pad 18 is more preferably not less than 300 nm. Moreover, from the viewpoint of production costs, the thickness is preferably not more than 500 nm <Negative Electrode>

A negative electrode 19 contacts the n-type contact layer 14a of the n-type semiconductor layer 14 that constitutes part of the semiconductor layer 20. Accordingly, as shown in FIG. 1 and FIG. 2, the negative electrode 19 is formed in a substantially circular shape on the exposed region 14d that is formed by removing a portion of the p-type semiconductor layer 16, the light-emitting layer 15 and the n-type semiconductor layer 14 to expose the n-type contact layer 14a. As the material for the negative electrode 19, negative electrodes of various compositions and structures are already well known, and any of these known negative electrodes can be used without any particular limitations.

As described above, the group III nitride semiconductor light emitting element 1 of this embodiment has a structure in which the intermediate layer 12 and the underlayer 13 having XRC half widths within the thus defined ranges, are laminated on the substrate 11, the amount of warping H of which has been previously set within the thus defined predetermined range, and the semiconductor layer 20 composed of group III nitride semiconductors and including the light emitting layer 15 is formed on the surface 13a of this underlayer 13. Therefore, the semiconductor layer 20, in particular, the light emitting layer 15, can have excellent crystallinity, and hence high emission intensity and stable emission wavelength can be obtained.

[Method for Manufacturing a Group III Nitride Semiconductor Light Emitting Element]

Figure 3A:
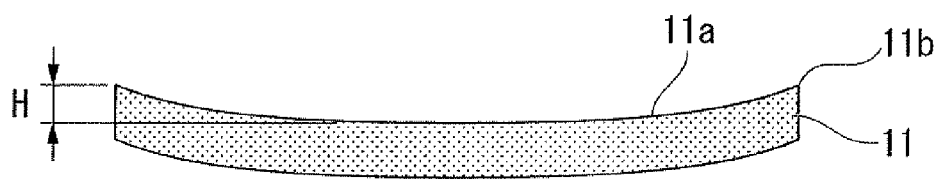
FIG. 3A is a diagram schematically illustrating an example of the method for manufacturing a group III nitride semiconductor light emitting element according to the present invention.
Figure 3B:
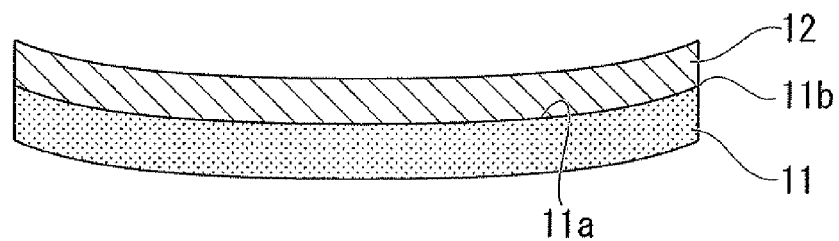
FIG. 3B is a diagram schematically illustrating the example of the method for manufacturing a group III nitride semiconductor light emitting element according to the present invention.
Figure 3C:
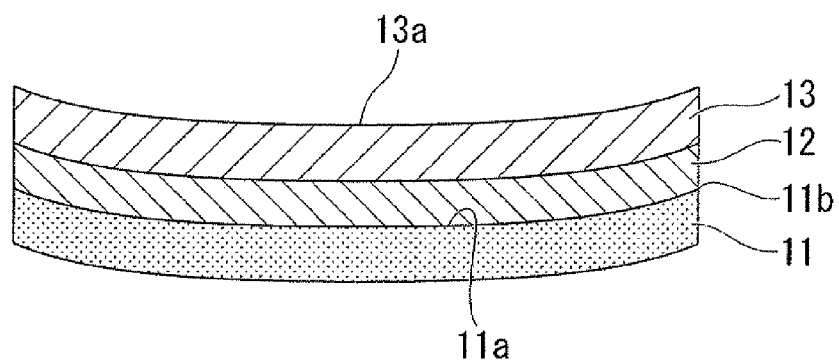
FIG. 3C is a diagram schematically illustrating the example of the method for manufacturing a group III nitride semiconductor light emitting element according to the present invention.

Hereunder is a description of the method for manufacturing a group III nitride semiconductor light emitting element of this embodiment, with appropriate reference to FIG. 3A to FIG. 3C.

The method for manufacturing a light emitting element of this embodiment is a method in which upon the formation of the light emitting element 1 as shown in FIG. 1, the intermediate layer 12, the underlayer 13, the n-type semiconductor layer 14, the light emitting layer 15, and the p-type semiconductor layer 16 are laminated in sequence on the principal plane 11a of the substrate 11, wherein: a substrate having a diameter of 4 inches (100 mm) or larger, with at least a part of the substrate edge 11b having an amount of warping H within a range from 0.1 to 30 μm, and more preferably from 1 to 20 μm, in the direction of warping toward the principal plane 11a, is prepared as the substrate 11; after forming the intermediate layer 12 on the substrate 11, the underlayer 13 in which a X-ray rocking curve half width of a (0002) plane is 100 arcsec or less and a X-ray rocking curve half width of a (10-10) plane is 300 arcsec or less, is formed on the intermediate layer 12; and furthermore the n-type semiconductor layer 14, the light emitting layer 15, and the p-type semiconductor layer 16 are formed on the surface 13a of the underlayer 13.

<Preparation of Substrate>

In the manufacturing method of this embodiment, firstly, as shown in FIG. 3A, a substrate 11 having a diameter of 4 inches and having an amount of warping H within the above-mentioned range, for example, is prepared.

It is preferable to pretreat the entire surface of the substrate 11, mainly the principal plane 11a, in advance. For example, the surface can be subjected to hydrogen termination by a known wet method such as RCA cleaning, the effect of which is that the following film formation process can be kept stable afterwards.

Further, the substrate 11 may also be placed inside a chamber of a sputtering apparatus, and pretreated by carrying out a reverse sputtering on the entire surface of the substrate 11 or the like, prior to the formation of the intermediate layer 12. Specifically, a method to clean the entire surface of the substrate 11, mainly the principal plane 11a, through exposure to Ar or $N_2$ plasma in a chamber of a sputtering apparatus can be adopted. By treating the surface of the substrate 11 with a plasma of Ar gas or $N_2$ gas or the like, any organic material or oxides adhered to the surface of the substrate 11 can be removed. In such a case, if no power is applied to the target side in the chamber, but rather, a voltage is applied between the substrate 11 and the chamber, then the plasma particles will act efficiently on the surface of the substrate 11.

In the manufacturing method of this embodiment, it is preferable to prepare, as the substrate 11, a substrate having a diameter of 4 inches (100 mm) or larger, with at least a part of the substrate edge 11b previously having an amount of warping H within a range from 0.1 to 30 μm in the direction of warping toward the principal plane 11a. In this embodiment, by setting the amount of warping H of the substrate 11 of itself within this range, it can be facilitated, after the formation of the intermediate layer 12 and the underlayer 13 on the substrate 11 and during the subsequent formation of the semiconductor layer 20 including the light emitting layer 15 thereon, to control the formed surface of the light emitting layer 15 to be in a flat state.

The method to previously give a predetermined amount of reverse warping to the substrate 11 can be exemplified by a method in which the substrate 11 is deformed by heating at a temperature of a degree that would not cause a damage, or a method in which the substrate 11 is deformed by applying a stress of a degree that would not cause a breakage of the substrate 11. It is also possible to employ both methods of heating the substrate 11 and applying a stress to the substrate 11.

<Formation of Intermediate Layer>

Next, as shown in FIG. 3B, the intermediate layer 12 is formed by sputtering on the principal plane 11a consisting of the sapphire c-plane of the substrate 11 which has been pretreated by the above-mentioned process and whose amount of warping H has been adjusted to the predetermined range.

As the method for forming the intermediate layer 12, a conventional method known as the method to grow a crystal of a group III nitride semiconductor can be employed without any particular problem. Such a method can be exemplified by an MOCVD method, an MBE method (Molecular Beam Epitaxy method), a sputtering method, an HVPE method (Hydride Vapor Phase Epitaxy method), and the like. Any one of these methods can be specifically used to form the intermediate layer 12 consisting of an $Al_xGa_{1-x}N$ ($0 \leq X \leq 1$) composition, for example AlN, on the principal plane 11a of the substrate 11.

The orientations of the underlayer 13 formed on the intermediate layer 12, and the n-type semiconductor layer 14 formed thereon are affected significantly by the crystal state of the intermediate layer 12. So far, the MOCVD method has been supposed to be preferable in order to produce the intermediate layer 12 of high crystallinity. However, the MOCVD method is a method in which a metal generated by decomposition of a raw material on the substrate 11 is gradually accumulated on the substrate. In the MOCVD method, because nuclei are first formed and crystals are then grown around these nuclei to gradually form the film, the film may not be homogenous enough in cases where a very thin film such as the intermediate layer 12 is to be formed. In contrast, a sputtering method is capable of forming a homogenous film even in cases where a very thin film is to be formed, and is also applicable to mass production. Therefore, the sputtering method is preferred. With the sputtering method, the intermediate layer 12 having a single crystal structure, or the intermediate layer having columnar crystals (polycrystals) of a suitable structure, for example, can be formed with ease.

In cases where the intermediate layer 12 is formed by a sputtering method, a pulsed DC sputtering method or an RF (high-frequency) sputtering method is more desirable than a DC sputtering method which tends to cause the target surface to be charged up and thereby may cause an unstable film formation rate. In addition, amongst sputtering methods, methods in which the plasma is confined within a magnetic field so as to improve the efficiency are generally used. In this case, in order to achieve a uniform film thickness, it is preferable to move the position of the magnet within the target. The specific method of moving the magnet in this case may be selected in accordance with the apparatus to be used. For example, a method of oscillating the magnet or a method of rotating the magnet can be adopted. Through this type of operation, an intermediate layer 12 having a single crystal structure or an intermediate layer 12 having an appropriate density of columnar crystals with distinct crystal grain boundaries can be formed.

In cases where the intermediate layer 12 is formed by a sputtering method, it is preferable to set the substrate temperature within a range from 300 to 800° C. upon the film formation. At a temperature lower than this range, the entire surface of the substrate 11 may not be covered by the intermediate layer 12, and some parts of the surface of the substrate 11 may be exposed. In contrast, at a temperature exceeding the above range, the metal raw material may migrate so actively that it becomes difficult to form an intermediate layer 12 having columnar crystals with distinct crystal grain boundaries. Thus, such temperatures are not preferred. Moreover, at a temperature exceeding the above range, the growth rate of the crystal may be so extremely slowed down that it becomes difficult to form an intermediate layer 12 having a single crystal structure. Thus, such high temperatures are not preferred.

In addition, in cases where the intermediate layer 12 is formed by a sputtering method, it is desirable to set the pressure inside the chamber at 0.3 Pa or higher. At a pressure lower than 0.3 Pa in the chamber, the abundance of nitrogen becomes so small that the sputtered metal may adhere to the substrate without becoming a nitride. Moreover, there are no particular upper limitations in the pressure inside the chamber, needless to say, however the pressure must be low enough to allow plasma generation.

Moreover, there is a preferred range for the ratio of the nitrogen flow rate relative to the total flow rate within the chamber including nitrogen and inert gas. If this nitrogen flow rate ratio is too low, the sputtered material may adhere to the substrate as an unmodified metal, whereas if the nitrogen flow rate ratio is too high, the quantity of inert gas may be so small that the sputtering rate would be lowered.

For forming an intermediate layer 12 having a single crystal structure, it is preferable to set the ratio of the nitrogen flow rate from 50% to 100%, and more preferably about 75%.

Moreover, for forming an intermediate layer 12 having columnar crystals (polycrystals), it is preferable to set the ratio of the nitrogen flow rate from 1% to 50%, and more preferably about 25%.

Here, as the nitrogen raw material for use in this technique, it is possible to employ a usually known nitrogen compound without any particular problem. For example, if nitrogen gas is used as the nitrogen raw material, a simple apparatus suffices but a high reaction rate cannot be achieved. However, it is possible, by decomposing the nitrogen using an electric field or heat or the like prior to introduction into the sputtering apparatus, to achieve a sufficient film formation rate for application to industrial production, although this film formation rate is still inferior to the rate achieved by using ammonia. Accordingly, if due consideration is also given to the cost of the apparatus, nitrogen is the most favorable nitrogen raw material.

In cases where the intermediate layer 12 is formed by a sputtering method, it becomes possible to form an intermediate layer 12 having a single crystal structure or an intermediate layer 12 having a favorable density of columnar crystals with distinct crystal grain boundaries, by setting the substrate temperature during the film formation, the pressure inside the chamber, and the ratio of the nitrogen flow rate relative to the total flow rate within the chamber including nitrogen and inert gas to values within the respective ranges described above.

By forming the intermediate layer 12 by a sputtering method in this manner, it becomes possible to form an intermediate layer 12 with favorable in-plane uniformity consisting of either a single crystal structure or a columnar crystal layer with aligned crystal surfaces. It also becomes possible to form an underlayer 13 and an n-type semiconductor layer 14 with excellent crystal orientation by epitaxial growth on such an intermediate layer 12. For example, when a group III nitride semiconductor such as GaN is formed on the intermediate layer 12 by an MOCVD method, crystal growth with a low dislocation density can be achieved because a single crystal structure or a columnar crystal layer with aligned crystal surfaces, constituting the intermediate layer 12, can act as a growth nucleus.

<Formation of Underlayer>

Next, as shown in FIG. 3C, the underlayer 13 is formed on the intermediate layer 12 that has been formed on the substrate 11.

In the manufacturing method of this embodiment, the underlayer 13 is formed from an $Al_xGa_{1-x}N$ layer ($0 \leq X \leq 1$, preferably $0 \leq X \leq 0.5$, and more preferably $0 \leq X \leq 0.1$), consisting of, for example, a composition such as AlGaN and GaN, by using a method described below.

In this embodiment, upon the completion of the formation of the intermediate layer 12 on the substrate 11 by the procedure mentioned above, annealing is not particularly necessary prior to the formation of the underlayer 13. However, in cases where the underlayer 13 is formed by a vapor phase chemical deposition method such as an MOCVD method, an MBE method, or an HVPE method, the substrate is generally subjected to a temperature raising step and a temperature stabilizing step that do not involve any film formation. During these steps, a group V raw material gas is often passed through, and as a result, it is possible to produce an annealing effect. However, this process does not represent a special application of an annealing effect, but is merely a typical conventional technique.

In addition, as for the carrier gas to pass through the system, any usual gas can be used without a problem. In other words, hydrogen or nitrogen, which are widely used in vapor phase chemical deposition methods such as MOCVD, may be used. However, raising the temperature in the presence of hydrogen, which is comparatively chemically active, may cause deterioration in the crystallinity or the flatness of the crystal surface, and therefore it is preferable to conduct this process within a short time.

There are no particular limitations in the technique for laminating the underlayer 13, as long as it is a crystal growth technique capable of making dislocation loops in the manner described above. An MOCVD method, an MBE method, and an HVPE method are preferred as they can allow dislocations to be looped through migration, meaning that a film of favorable crystallinity can be formed. Of these methods, preferred is the MOCVD method as it yields a film with the best level of crystallinity.

As mentioned above, in the manufacturing method of this embodiment, it is preferable to carry out the film formation so that the XRC half width of the (0002) plane is 100 arcsec or less and the XRC half width of the (10-10) plane is 300 arcsec or less, in a state where the underlayer 13 and the n-type contact layer 14a are formed on the intermediate layer 12. Moreover, in this embodiment, it is more preferable to carry out the film formation so that the XRC half width of the (0002) plane is 50 arcsec or less and the XRC half width of the (10-10) plane is 250 arcsec or less.

In the manufacturing method of this embodiment, it becomes possible, by controlling the XRC half widths after forming underlayer 13 and the n-type contact layer 14a on the intermediate layer 12 within the above-mentioned ranges, and furthermore by stipulating the amount of warping H of the substrate 11 to be within the above-mentioned range, to suppress the amount of warping H of the substrate 11 to approximately 0 (zero) μm upon the formation of the light emitting layer 15 included in the semiconductor layer 20 that will be described later. By so doing, the light emitting layer 15 consisting of a group III nitride semiconductor of excellent crystallinity can be formed.

In cases where the underlayer 13 is formed by a MOCVD method, the substrate temperature is preferably 800° C. or higher. This is because, with a higher substrate temperature, atoms can more readily migrate and thereby dislocation loops can be more readily promoted. More preferred is 900° C. or higher, and most preferred is 1000° C. or higher. Needless to say, the substrate temperature during film formation of the underlayer 13 must be lower than the temperature at which the crystals decompose, and temperatures of 1200° C. or higher are unsuitable for the temperatures to grow the underlayer 13.

In addition, it is also possible to form the underlayer 13 by a sputtering method. It is preferable to form the underlayer 13 by a sputtering method, because the film formation rate can be improved and the apparatus can be configured simpler than that required for an MOCVD method or an MBE method.

In cases where the underlayer 13 is formed by a sputtering method, for example, the following procedure can be taken: argon or nitrogen gas is introduced into the chamber of the sputtering apparatus; the temperature of the substrate 11 is then increased; a high-frequency bias is applied to the substrate 11 side while at the same time applying power to the sputtering target side formed of metallic Ga; and the underlayer 13 is deposited on the substrate 11 while keeping the pressure inside the chamber at a predetermined value.

As the sputtering method for use in the formation of the underlayer 13, it is preferable to employ either an RF (high-frequency) sputtering method or a DC sputtering method so as to thereby apply power to the sputtering target.

Moreover, in cases where the underlayer 13 is formed by a sputtering method, it is preferable to form it by using a reactive sputtering method in which the nitride raw material is passed through the reactor, because a favorable level of crystallinity can be maintained by controlling the reaction, and that favorable level of crystallinity can be stably reproduced.

When a reactive sputtering method is used, an RF sputtering method is more preferred as it enables easy control of the film formation rate. When a DC sputtering method is employed with a reactive sputtering method, the sputtering target is prone to be charged up by continuous application of the electric field through direct current, which makes it difficult to increase the film formation rate. Therefore, preferred is a pulsed DC sputtering method in which the bias is applied in a pulsed manner.

In addition, when a semiconductor layer is formed by a sputtering method, it is preferable to either rotate or oscillate the magnetic field relative to the sputtering target. Particularly in the case of the RF sputtering, in order to achieve a uniform film thickness, it is preferable to form the film while moving the position of the magnet within the sputtering target.

In this embodiment, when the underlayer 13 is formed by a sputtering method, the ratio of the $N_2$ flow rate relative to the total flow rate including nitrogen ($N_2$) and argon (Ar) is preferably within a range from 20% to 90%. If the $N_2$ flow rate ratio is below this range, the sputtered raw material may adhere to the substrate as an unmodified metal. In contrast, if the flow rate ratio is above this range, the quantity of Ar may be so small that the sputtering rate would be lowered.

Furthermore, in this embodiment, the $N_2$ concentration within the gas inside the chamber of the sputtering apparatus is increased, and the heavier gas Ar is then mixed at the flow rate ratio described above. If the gas within the chamber consists of $N_2$ alone, the impact strength on the metal target is weak, which may limit the film formation rate. In this embodiment, it becomes possible, by mixing with the heavier Ar at the flow rate ratio described above, to increase the film formation rate, and to activate the migration on the substrate 11.

As the nitrogen raw material for use in the present embodiment, besides the nitrogen gas described above, any other usually known nitrogen compound can be used without any limitation, although ammonia and nitrogen gas are preferred, as they are easy to handle and are available at comparatively inexpensive cost. The nitrogen gas makes it possible, if a method to decompose the nitrogen gas using an electric field or heat or the like prior to introduction into the sputtering apparatus is taken, to achieve a sufficient film formation rate for application to industrial production, although this film formation rate is lower than the rate achieved by using ammonia. Accordingly, if due consideration is also given to the cost of the apparatus, nitrogen gas is the most favorable nitrogen source.

In the manufacturing method of this embodiment, during the formation of the underlayer 13, it is preferable to set the pressure inside the chamber at 10 Pa or lower, more preferably 5 Pa or lower, and most preferably 1 Pa or lower. If the pressure inside the chamber is within this range, an underlayer 13 with favorable crystallinity can be formed quite efficiently. If the pressure inside the chamber exceeds 10 Pa, an underlayer 13 with favorable crystallinity may not be produced.

In cases where the underlayer 13 is formed by a sputtering method, the pressure inside the chamber is preferably 0.3 Pa or higher. If the pressure inside the chamber is lower than 0.3 Pa, the abundance of nitrogen becomes so small that the sputtered metal may adhere to the substrate 11 without becoming a nitride.

In cases where the underlayer 13 is formed by sputtering, the temperature of the substrate 11 is preferably within a range from 400 to 1300° C. By setting the substrate 11 at a higher temperature during the formation of the underlayer 13, atoms can more readily migrate and thereby dislocation loops can be more readily promoted. In addition, the temperature of the substrate 11 during the formation of the underlayer 13 must be lower than the temperature at which the crystals decompose, and thus is preferably lower than 1300° C.

In the manufacturing method of this embodiment, by setting the temperature of the substrate 11 within the above-mentioned range during the formation of the underlayer 13 by a sputtering method, the movement of the reaction seeds (the metal extracted from the metal target) reaching the substrate 11 can be activated at the crystal surface, enabling to produce an underlayer 13 of excellent crystallinity.

Moreover, the film formation rate during the formation of the underlayer 13 by a sputtering method is preferably within a range from 0.1 to 10 nm/sec. If this film formation rate is lower than 0.1 nm/s, the film formation process takes a long time, which is wasteful from an industrial production perspective. In contrast, if the film formation rate exceeds 10 nm/s, it becomes difficult to produce a favorable film.

It becomes possible, by forming the underlayer 13 by a sputtering method, to accelerate the film formation rate over the case using an MOCVD method, and to shorten the film formation (production) time. Further, by shortening the production time, contamination of the inside of the chamber of the sputtering apparatus with impurities can be minimized, meaning that an underlayer 13 of high quality can be formed.

<Formation of Semiconductor Layer>

In this embodiment, the method for growing the gallium nitride-based compound semiconductor (group III nitride semiconductor) for forming the semiconductor layer 20 is not specifically limited. Besides the MOCVD method (Metal Organic Chemical Vapor Deposition method), it is possible to employ all of the other methods known to be able to grow a nitride semiconductor, such as a sputtering method, an HVPE (Hydride Vapor Phase Epitaxy method), and an MBE (Molecular Beam Epitaxy method). Of these, the MOCVD method is preferred as it enables to produce a semiconductor layer of excellent crystallinity.

In the MOCVD method; hydrogen ($H_2$) or nitrogen ($N_2$) can be used as the carrier gas; trimethyl gallium (TMG) or triethyl gallium (TEG) can be used as the Ga source that represents the group III raw material; trimethyl aluminum (TMA) or triethyl aluminum (TEA) can be used as the Al source; trimethyl indium (TMI) or triethyl indium (TEI) can be used as the In source; and ammonia ($NH_3$) or hydrazine ($N_2H_4$) can be used as the N source that represents the group V raw material.

As the n-type dopant, monosilane ($SiH_4$) or disilane ($Si_2H_6$) can be used as the Si raw material, and germane gas ($GeH_4$) or an organogermanium compound such as tetramethyl germanium (($CH_3)_4Ge$) or tetraethyl germanium (($C_2H_5)_4Ge$) can be used as the Ge raw material.

As the p-type impurity as a dopant element, for example, biscyclopentadienyl magnesium ($Cp_2Mg$) or bisethylcyclopentadienyl magnesium ($EtCp_2Mg$) can be used as the Mg raw material.

The group III nitride semiconductor as mentioned above may also contain any other group III elements differing from Al, Ga and In, and if necessary, may also contain a dopant element such as Ge, Si, Mg, Ca, Zn, and Be. Furthermore, the semiconductor may contain not only elements that have been intentionally added, but also impurities that are unavoidably contained as a result of the film formation conditions, and very small quantities of impurities coming from raw materials or reaction tube materials.

(Formation of n-type Semiconductor Layer)

First, as shown in FIG. 1, the n-type contact layer 14a and the n-type cladding layer 14b are formed in this order on the surface 13a of the underlayer 13 by using a conventionally known MOCVD method. At this time, each layer of the n-type contact layer 14a and the n-type cladding layer 14b can be formed by the same MOCVD apparatus. The apparatus can also be shared in forming the light emitting layer 15 that will be described later. In this case, various conditions of the MOCVD apparatus have to be appropriately changed to form each layer.

(Formation of Light Emitting Layer)

Next, as shown in FIG. 1, the light emitting layer 15 is formed on the n-type cladding layer 14b by an MOCVD method.

The light emitting layer 15 to be formed in the manufacturing method of this embodiment has a multiquantum well (MQW) structure that begins with a GaN barrier layer and ends with a GaN barrier layer, which is formed by alternately laminating six barrier layers 15a consisting of GaN and five well layers 15b consisting of undoped $Ga_{0.92}In_{0.08}N$.

In the manufacturing method of this embodiment, the same MOCVD apparatus that has been used for forming the n-type semiconductor layer 14 can be used, in which case, the light emitting layer 15 can be formed by changing various film formation conditions.

When the light emitting layer 15 having a multiquantum well structure is formed by using an MOCVD method, it is usual to carry out the film formation by setting the temperature to grow the well layer 15b at about 600 to 800° C., and the temperature to grow the barrier layer 15a at about 750 to 1000° C., for example. That is, during the formation of the light emitting layer 15, the wafer has to be heated at high temperature reaching a maximum of about 1000° C. So far, there has been concern in that; even if the wafer has been set flat without warping, since the coefficients of thermal expansion are different between the substrate and the underlayer, the substrate warps in such a way that the substrate edge goes to the principal plane side due to the heating at high temperature during the formation of the light emitting layer, and as a result the substrate and the wafer as a whole may largely warp.

This embodiment adopts a method in which a substrate having a diameter of 4 inches (100 mm) or larger, with at least a part of the substrate edge 11b previously having an amount of warping H within a range from 0.1 to 30 μm, in the direction of warping toward the principal plane 11a, is prepared as the substrate 11. Furthermore, film formation is carried out so that the XRC half width of the (0002) plane is 100 arcsec or less and the XRC half width of the (10-10) plane is 300 arcsec or less, in a state where the underlayer 13 and the n-type contact layer 14a are formed on the intermediate layer 12. It becomes possible, by controlling the XRC half widths within the above-mentioned ranges and furthermore by previously stipulating the amount of warping H of the substrate 11 to be within the above-mentioned range in this manner, to suppress the amount of warping H of the substrate 11 to approximately 0 (zero) μm upon the formation of the light emitting layer 15 included in the semiconductor layer 20 that will be described later. By so doing, the growth surface can be kept substantially flat during the formation of the light emitting layer 15 at a growth temperature of about 750° C. for example; which makes it possible to form a light emitting layer 15 of excellent crystallinity. Accordingly, the In concentration in the layer can be homogenized, by which the emission intensity and the emission wavelength can be set uniform over the entire surface of the light emitting layer 15 formed on the substrate 11, and hence excellent light emission characteristics can be obtained.

Here, in the case of a light emitting element of a conventional type of structure, the coefficients of thermal expansion are different between the substrate and the underlayer. Therefore due to the high temperature during the formation of the underlayer on the substrate, typically warping may occur in such a way that the substrate edge goes to the backside of the substrate, being the opposite side of the principal plane. If the light emitting element is constructed by forming a semiconductor layer on the underlayer placed on the thus warped substrate, the composition in terms of the In concentration, the film thickness, and like properties become nonuniform inside the light emitting layer. In this case there is a problem in that the crystallinity may be deteriorated, thus the emission intensity and the emission wavelength in the light emission plane may become nonuniform, and thereby the light emission characteristics may be deteriorated.

Moreover, if, in order to reduce such warping caused by the difference of the coefficient of thermal expansion between the substrate and the underlayer, the underlayer is made thin, there is a problem in that the crystallinity of the underlayer may be deteriorated, the crystallinity of the semiconductor layer including the light emitting layer formed thereon may also be deteriorated, and thereby the light emission characteristics may be deteriorated.

In contrast, the method for manufacturing the light emitting element 1 of this embodiment adopts a method in which a substrate having a diameter of 4 inches (100 mm) or larger, with at least a part of the substrate edge 11b having an amount of warping H within a range from 0.1 to 30 μm in the direction of warping toward the principal plane 11a, is prepared as the substrate 11; the X-ray rocking curve half width of the (0002) plane is 100 arcsec or less and the X-ray rocking curve half width of the (10-10) plane is 300 arcsec or less, in a state where the intermediate layer 12 has been formed on this substrate 11 and where thereafter the underlayer 13 and the n-type contact layer 14a are formed on the intermediate layer 12; and furthermore respective layers of the semiconductor layer 20 including the light emitting layer 15 are formed on this n-type contact layer 14a. By so doing, the amount of warping H of the substrate 11 can be suppressed to approximately 0 (zero) μm upon the formation of the light emitting layer 15, and thus the growth surface can be kept substantially flat; which makes it possible to form a light emitting layer 15 of excellent crystallinity. Accordingly, the In concentration in the entire surface of the light emitting layer 15 formed on the substrate 11 can be homogenized, which makes it possible to produce a light emitting element 1 having excellent light emission characteristics.

Here, the term "warping of substrate" is defined as the value obtained by subtracting the longest distance from the shortest distance, the distance being the difference between a horizontal reference plane and the wafer surface when the substrate is placed on the reference plane. In the present invention, the amount of warping H of the substrate 11 was measured by obtaining the SORI value with the NIDEK's laser-based oblique incidence interferometer (flatness tester FT-17). Moreover, if the warping is in a concave shape, in other words, if the substrate edge warps in a direction toward the principal plane side of the substrate, a negative value was applied.

(Formation of p-type Semiconductor Layer)

The p-type semiconductor layer 16 composed of the p-type cladding layer 16a and the p-type contact layer 16b is formed on the light emitting layer 15, in other words, the barrier layer 15a being the outermost layer of the light emitting layer 15, by an MOCVD method. The p-type semiconductor layer 16 can be formed by using the same MOCVD apparatus that has been used for forming the n-type semiconductor layer 14 and the light emitting layer 15 while changing various film formation conditions.

For the formation of the p-type semiconductor layer 16, a p-type cladding layer 16a consisting of Mg-doped $Al_{0.1}Ga_{0.9}N$ is first formed on the light emitting layer 15 (the barrier layers 15a as the outermost layer) and then a p-type contact layer 16b consisting of Mg-doped $Al_{0.02}Ga_{0.98}N$ is formed thereon. At this time, the same MOCVD apparatus can be used for the deposition of the p-type cladding layer 16a and the p-type contact layer 16b.

Moreover, as described above, as the p-type impurity, not only Mg but also, for example, zinc (Zn) can be used in the same manner.

<Formation of Translucent Positive Electrode>

The translucent positive electrode 17 consisting of ITO is formed on the p-type contact layer 16b of the semiconductor 20 in which the respective layers have been formed by the above-mentioned method.

The method for forming the translucent positive electrode 17 is not particularly limited, and a commonly used means well known in the art, such as a photolithography method, can be adopted to provide the translucent positive electrode 17. In addition, its structure may be any one of conventionally well known structures or any other structure without any limitation.

Moreover, as mentioned above, the material of the translucent positive electrode 17 is not limited to ITO, and it is possible to form it by using other materials such as AZO, IZO, and GZO.

Furthermore, after the formation of the translucent positive electrode 17, thermal annealing for the purpose of alloying or translucent finishing may be either applied or not applied.

<Formation of Positive Electrode and Negative Electrode>

The positive electrode (positive electrode bonding pad) 18 is further formed on the translucent positive electrode 17 that has been formed on the laminated semiconductor 10.

This positive electrode 18 can be formed by depositing respective materials of Ti, Al, and Au, for example, in this order from the surface side of the translucent positive electrode 17 through a conventionally well known method.

Moreover, upon the formation of the negative electrode 19, firstly, an exposed domain 14d (refer to FIG. 1 and FIG. 2) is formed in the n-type contact layer 14b by removing the p-type semiconductor layer 16, the light emitting layer 15, and a part of the n-type semiconductor layer 14 that has been formed on the substrate 11, by a method such as dry etching. Then, on this exposed domain 14d, a negative electrode 19 of a quadruple layer structure, details of which are not shown, can be formed by depositing respective materials of Ni, Al, Ti, and Au, for example, in this order from the surface side of the exposed domain 14d through a conventionally well known method.

Then, the wafer in which the translucent positive electrode 17, the positive electrode 18, and the negative electrode 19 have been provided on the thus formed semiconductor layer 20, is subjected to grinding and polishing on the backside of the substrate 11 to make a mirror-like plane, followed by cutting into pieces of 350 μm squares, for example. By so doing, a light emitting element chip (light emitting element 1) can be produced.

As described above, the method for manufacturing a group III nitride semiconductor light emitting element 1 of this embodiment is a method in which the substrate 11 having a diameter of 4 inches (100 mm) or larger, with at least a part of the substrate edge 11b having an amount of warping H within a range from 0.1 to 30 μm in the direction of warping toward the principal plane 11a, is prepared; the X-ray rocking curve half width of the (0002) plane is 100 arcsec or less and the X-ray rocking curve half width of the (10-10) plane is 300 arcsec or less, in a state where the intermediate layer 12 has been formed on this substrate 11 and where thereafter the underlayer 13 and the n-type contact layer 14a are formed on the intermediate layer 12; and furthermore the n-type cladding layer 14b, the light emitting layer 15, the p-type cladding layer 16a, and the p-type contact layer 16b are formed on this n-type contact layer 14a. Therefore, warping can be suppressed as much as possible after the formation of the respective layers on the substrate 11, and thus a semiconductor layer 20 having a light emitting layer 15 of excellent crystallinity can be formed thereon. By so doing, a group III nitride semiconductor light emitting element 1 with excellent emission intensity and stable emission wavelength can be produced.

[Lamp]

The lamp of the present invention comprises the light emitting element of the present invention, which can be exemplified by a lamp comprising a combination of the light emitting element and fluorescent substance(s). The structure of the lamp comprising a combination of the light emitting element and fluorescent substance(s) can be a type well known to those skilled in the art, which can be constituted by a means well known to those skilled in the art. Hitherto, a technique to change emission colors by combining a light emitting element with fluorescent substances has been known, and such a technique can be adopted for the lamp of the present invention without any limitation.

For example, it becomes possible to emit light having a wavelength longer than that of the light emitting element per se by properly selecting fluorescent substance(s) for use in the lamp, and further, it is also possible to produce a lamp that can emit white light by mixing the emission wavelength of the light emitting element of itself and wavelength(s) converted by fluorescent substance(s).

Figure 4:
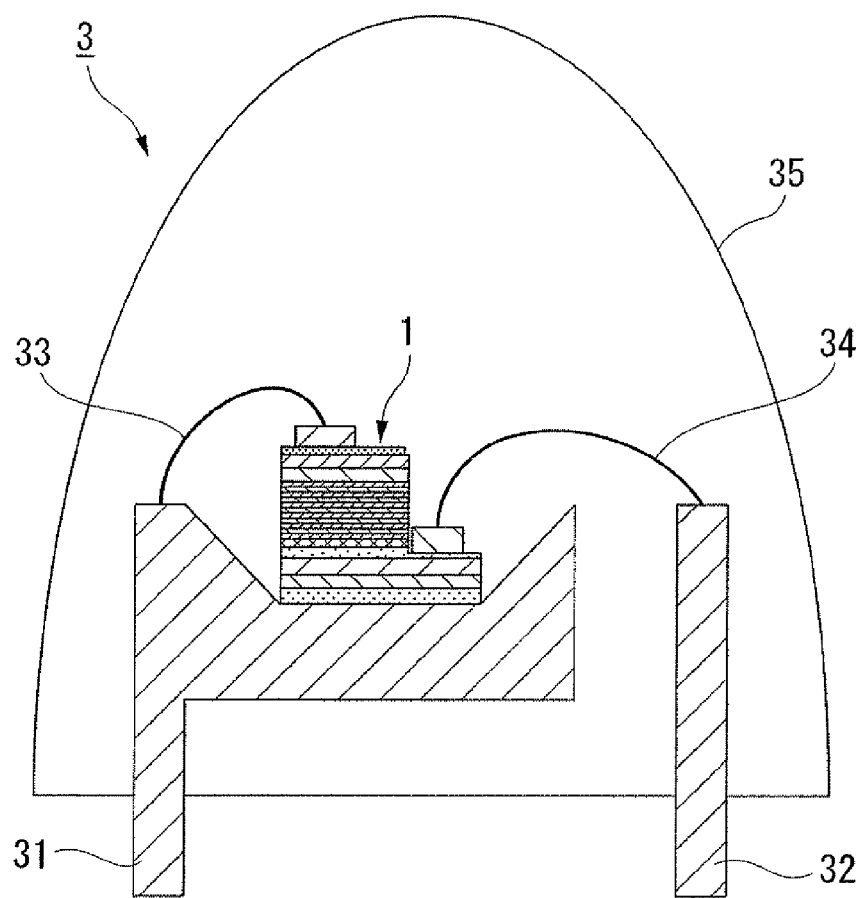
FIG. 4 is a diagram schematically illustrating an example of a lamp constituted by using the group III nitride semiconductor light emitting element according to the present invention.
Figure 5A:
FIG. 5A is a cross-sectional view schematically illustrating the structure of a conventional semiconductor substrate.
Figure 5B:
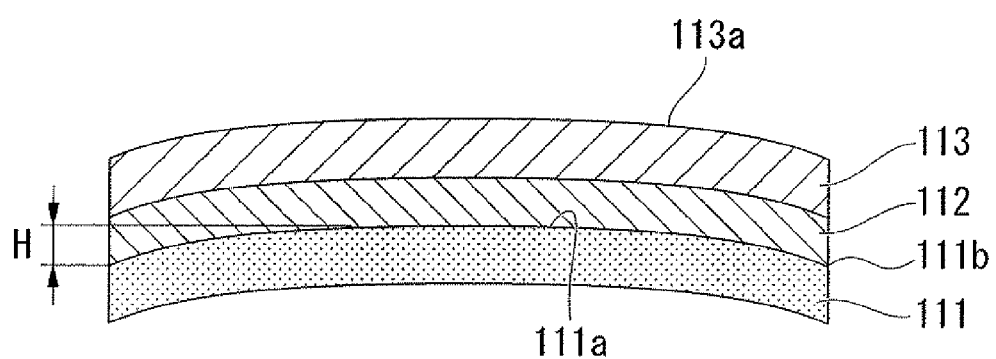
FIG. 5B is a cross-sectional view schematically illustrating the structure of a conventional semiconductor substrate.

FIG. 4 is a diagram schematically illustrating an example of such a lamp comprising the group III nitride compound semiconductor light emitting element of the present invention. The lamp 3 shown in FIG. 4 is of a projectile type, which uses the light emitting element 1 of FIG. 1. As shown in FIG. 4, a positive electrode bonding pad (refer to the symbol 18 of FIG. 1) of the light emitting element 1 is bonded to either one of two frames 31 and 32 (frame 31 in FIG. 4) through a wire 33, and a negative electrode (refer to the symbol 19 of FIG. 1) of the light emitting element 1 is connected to the other frame 32 through a wire 34. By so doing, the light emitting element 1 is mounted. Moreover, the surroundings of the light emitting element 1 are molded with a mold 35 made of a transparent resin.

The lamp of the present invention comprises the light emitting element 1 of the present invention, and therefore has excellent light emission characteristics.

Moreover, the lamp of the present invention may be used for any application, such as a projectile type for general use, a side view type for use in a portable back light, and a top view type for use in an indicator.

[Other Semiconductor Elements (Devices)]

The lamination structure comprising the group III nitride semiconductors of excellent crystallinity produced by the present invention (refer to the light emitting element 1 of FIG. 1) can be not only applied to semiconductor layers provided for light emitting elements such as a light emitting diode (LED) and a laser diode (LD) as mentioned above, but also applied to lamination structures for photoelectricity conversion elements such as a solar cell and a photo acceptance element, or electronic devices such as HBT (Heterojunction Bipolar Transistor) and HEMT (High Electron Mobility Transistor). Lots of various structures are known for these semiconductor elements, and the lamination structure of group III nitride semiconductors according to the present invention is not limited at all, including the application to these well known element structures.

EXAMPLES

Next is a more detailed description of the method for manufacturing a group III nitride semiconductor light emitting element, the group III nitride semiconductor light emitting element, and the lamp, of the present invention, with reference to Examples. However, it should be noted that the present invention is not to be limited to these Examples.

Example 1

In this Example, an AlN layer was formed as the intermediate layer 12 by an RF sputtering method on the c-plane (principal plane 11a) of the sapphire substrate 11 having a diameter of 4 inches (100 mm). A GaN layer was formed as the underlayer 13 thereon by an MOCVD method. By so doing, a wafer in which the intermediate layer 12 and the underlayer 13 were deposited on the substrate 11 was produced. Then, further, the semiconductor layer 20 was formed on the underlayer 13, by which the light emitting element 1 as shown in FIG. 1 was produced. Moreover, the lamp 3 (light emitting diode: LED) as shown in FIG. 4 was produced using this light emitting element 1.

<Preparation of Substrate>

First, a sapphire substrate 11 having a diameter of 4 inches (101.6 mm; simply expressed as 100 mm in the description of this application) was prepared, and was subjected to both methods of heating and applying a stress so as to adjust the substrate 11 such that at least a part of the substrate edge 11b had an amount of warping H of about 10 μm in the direction of warping toward the principal plane 11a.

Next, the entire surface of the substrate 11, mainly the principal plane 11a consisting of the sapphire c-plane, was pretreated by a known wet method such as RCA cleaning.

Then, the substrate 11 was placed in a sputtering apparatus, and the substrate was heated to 500° C. in the chamber. The pressure was kept at 1 Pa with nitrogen gas, and a high frequency bias of 500 W was applied to the substrate side, to thereby expose the substrate to a nitrogen plasma. By so doing, the entire surface of the substrate 11 was cleaned.

<Formation of Intermediate Layer>

Subsequently, argon gas and nitrogen gas were introduced into the chamber, and then the temperature of the substrate was raised to 500° C. High frequency power of 2000 W was then applied to the target side, and with the pressure inside the furnace held at 0.5 Pa and under conditions including an argon gas flow rate of 5 sccm and a nitrogen gas flow rate of 15 sccm (nitrogen ratio relative to total gas flow rate was 75%), film formation of an AlN layer on the principal plane 11a of the substrate 11 was commenced. Following the formation of the AlN intermediate layer 12 having a single crystal structure with a thickness of 50 nm, at a growth rate of 0.08 nm/s, plasma generation was halted, and the substrate temperature was cooled.

The formation of the intermediate layer 12 was performed using a sputtering apparatus having a high-frequency power source and a mechanism for moving the position of the magnet within the target, and a metallic Al target as the target. The magnet within the target was oscillated during both the cleaning of the substrate 11 and the formation of the intermediate layer 12.

Then, the X-ray rocking curve (XRC) of the intermediate layer 12 formed on the substrate 11 was measured using an X-ray measurement apparatus (model: X'pert Pro MRD, manufactured by Spectris plc). This measurement was conducted by using a CuKα X-ray beam generation source as the light source. As a result, it was confirmed that the intermediate layer 12 had excellent characteristics by showing the XRC half width of 0.1°, and that the orientation of the intermediate layer 12 was favorable.

<Formation of Underlayer>

Next, the sample having the intermediate layer 12 formed on the substrate 11 was taken out from the chamber of the sputtering apparatus and placed in an MOCVD apparatus. Then, a GaN underlayer 13 was formed on the intermediate layer 12 by the procedure described below.

First, the sample having the intermediate layer 12 formed on the substrate 11 was placed in an MOCVD apparatus. Next, following the commencement of nitrogen gas flow into the reaction furnace, the heater was activated to raise the substrate temperature from room temperature to 500° C. Then, while keeping the substrate temperature at 500° C., ammonia gas and nitrogen gas were supplied to set the pressure inside the vapor deposition reaction furnace at 95 kPa. Subsequently, the substrate temperature was raised to 1000° C. to subject the surface of the substrate to thermal cleaning. Even after the completion of this thermal cleaning, the supply of nitrogen gas to the vapor deposition reaction furnace was continued.

Thereafter, with the supply of ammonia gas continued, the temperature of the substrate was raised to 1100° C. in a hydrogen atmosphere, and the pressure inside the reaction furnace was adjusted to 40 kPa. After confirming that the substrate temperature had been stabilized at 1100° C., supply of trimethyl gallium (TMG) to the furnace was commenced, thereby starting a film formation process of a group III nitride semiconductor (GaN) to form the underlayer 13 on the intermediate layer 12. Once GaN had grown in this manner, the TMG supply valve was switched to halt the supply of the raw material to the reaction furnace, thereby halting the growth of GaN.

By following the above process, the underlayer 13 consisting of undoped GaN with a thickness of 8 μm was formed on the intermediate layer 12 consisting of AlN of a single crystal structure that had been formed on the substrate 11.

<Formation of n-type Contact Layer>

First, the n-type contact layer 14a was formed on the surface 13a of the underlayer 13. At this time, upon the formation of the n-type contact layer 14a, a GaN layer was deposited while doping with Si by the same MOCVD apparatus that had been used to deposit the underlayer 13. At this time, crystal growth was conducted under the same conditions as those for the underlayer 13 with the exception that $SiH_4$ was supplied as the Si dopant raw material.

By following the above process, the n-type contact layer 14a consisting of an Si-doped GaN at a carrier concentration of $5 \times 10^{18}$ $cm^{-3}$ with a thickness of 2 μm was formed on the underlayer 13.

The X-ray rocking curves (XRC) in the state where the underlayer 13 and the n-type contact layer 14a had been formed on the intermediate layer 12 in the above-mentioned manner, were measured using an X-ray measurement apparatus (model: X'pert Pro MRD, manufactured by Spectris plc). The measurements were conducted using a Cuβ X-ray beam generation source as the light source for the symmetrical (0002) plane and the asymmetrical (10-10) plane. Generally, in the case of a group III nitride semiconductor, the XRC spectrum half width of the (0002) plane indicates the crystal flatness (mosaicity), and the XRC spectrum half width of the (10-10) plane indicates the dislocation density (twist). As a result of these measurements, the sample produced by the manufacturing method of the present invention showed a (0002) half width of 37 arcsec and a (10-10) half width of 220 arcsec.

<Formation of n-type Cladding Layer>

Next, the n-type cladding layer 14b was deposited on the n-type contact layer 14a by an MOCVD method.

First, the sample having the n-type contact layer 14a deposited by the procedure described above was placed in the same MOCVD apparatus, and with a supply of ammonia gas and using nitrogen as a carrier gas, the substrate temperature was lowered to 760° C.

At this time, while waiting for the temperature inside the furnace to adjust, the $SiH_4$ supply rate was set. The quantity of required $SiH_4$ was calculated in advance. This was adjusted to yield an electron concentration of $4\times10^{18}$ cm$^{-3}$ in the Si-doped layer. The supply of ammonia to the furnace was kept continued at the same flow rate.

Next, with supply of ammonia gas throughout the chamber, $SiH_4$ gas and vapors of TMI and TEG generated by bubbling were supplied to the furnace, thereby forming a layer of $Ga_{0.99}In_{0.01}N$ with a thickness of 1.7 nm, and a layer of GaN with a thickness of 1.7 nm. After repeating 19 cycles of this type of film formation process, a layer of $Ga_{0.99}In_{0.01}N$ with a thickness of 1.7 nm was formed again. In addition, the flow of $SiH_4$ was kept continued during the process of these steps. By so doing, the n-type cladding layer 14b composed of a superlattice structure of Si-doped $Ga_{0.99}In_{0.01}N$ and GaN was formed.

<Formation of Light Emitting Layer>

The light emitting layer 15 is composed of GaN barrier layers 15a and $Ga_{0.92}In_{0.08}N$ well layers 15b in a multiquantum well structure. Upon the formation of this light emitting layer 15, a barrier layer 15a is first formed on the n-type cladding layer 14b composed of a superlattice structure of Si-doped GaInN and GaN, and an $In_{0.2}Ga_{0.8}N$ well layer 15b is then formed on top of this barrier layer 15a. In this example, this type of deposition procedure was repeated five times, and a sixth barrier layer 15a was formed on the fifth laminated well layer 15b, thereby forming a structure in which barrier layers 15a were positioned at both sides of the light emitting layer 15 of a multiquantum well structure.

First, with the substrate temperature held at 760° C., supply of TEG and $SiH_4$ to the furnace was commenced, and an initial barrier layer consisting of Si-doped GaN with a thickness of 0.8 nm was formed over a predetermined time period. Thereafter, the supply of TEG and $SiH_4$ was halted. Then, the temperature of the susceptor was raised to 920° C. Next, the supply of TEG and $SiH_4$ to the furnace was restarted, and with the substrate temperature held at 920° C., an intermediate barrier layer with a thickness of 1.7 nm was deposited. Thereafter, the supply of TEG and $SiH_4$ to the furnace was halted. The susceptor temperature was lowered to 760° C., and the supply of TEG and $SiH_4$ was again restarted. Following the formation of a final barrier layer with a thickness of 3.5 nm, the supply of TEG and $SiH_4$ was once again halted, completing the formation of the GaN barrier layer. Through this three-step film formation process, an Si-doped GaN barrier layer (the barrier layer 15a) composed of the initial barrier layer, the intermediate barrier layer, and the final barrier layer was formed with the total film thickness of 6 nm. The quantity of $SiH_4$ was adjusted to yield an Si concentration of $1\times10^{17}$ cm$^{-3}$.

Following the formation of the GaN barrier layer described above (the barrier layer 15a), TEGa and TMIn were supplied to the furnace to conduct the film formation of a well layer, thereby forming a $Ga_{0.92}In_{0.08}N$ layer with a thickness of 3 nm (the well layer 15b).

Then, following the formation of the $Ga_{0.92}In_{0.08}N$ well layer 15b, the setting of the TEGa supply rate was altered. Subsequently, the supply of TEG and $SiH_4$ was restarted to form a second barrier layer 15a.

By repeating the above-mentioned process five times, five barrier layers 15a of Si-doped GaN and five well layers 15b of $Ga_{0.92}In_{0.08}N$ were formed.

Then, following the formation of the fifth $Ga_{0.92}In_{0.08}N$ well layer 15b, the sixth barrier layer was formed. Upon the formation process of the sixth barrier layer, the supply of $SiH_4$ was first halted, then an initial barrier layer consisting of undoped GaN was formed, thereafter the substrate temperature was raised to 920° C. while keeping the supply of TEGa to the furnace continued to thereby form an intermediate barrier layer over a prescribed time period at this substrate temperature of 920° C., and then the supply of TEGa to the furnace was halted. Subsequently, the substrate temperature was lowered to 760° C., the supply of TEGa was restarted, and following the formation of a final barrier layer, the supply of TEGa was once again halted, completing the formation of the GaN barrier layer. By so doing, an undoped GaN barrier layer composed of three layers, namely, the initial barrier layer, the intermediate barrier layer, and the final barrier layer, was formed with the total film thickness of 4 nm (refer to the uppermost barrier layer 15a of the light emitting layer 15 in FIG. 2).

By the above-mentioned process, the light emitting layer 15 of a multiquantum well structure containing well layers of non-uniform thicknesses (equivalent to the first to fourth well layers 15b from the n-type semiconductor layer 14 side in FIG. 2) and a well layer of a uniform thickness (equivalent to the fifth well layer 15b from the n-type semiconductor layer 14 side in FIG. 2), was formed.

Then, after the light emitting layer 15 had been formed by the respective processes mentioned above, the amount of warping H of the substrate 11 was checked. The amount of warping was found to be approximately 0 (zero) μm, meaning that the substrate 11 was substantially flat.

<Formation of p-type Semiconductor Layer>

After the respective processes mentioned above, using the same MOCVD apparatus, the p-type cladding layer 16a having a superlattice structure composed of four layers of undoped $Al_{0.06}Ga_{0.94}N$ and three layers of Mg-doped GaN was formed, and then the p-type contact layer 16b consisting of Mg-doped GaN with a thickness of 200 nm was formed thereon, completing the formation of the p-type semiconductor layer 16.

First, the substrate temperature was raised to 975° C. with a supply of ammonia gas. Then, the carrier gas was switched from nitrogen to hydrogen at the same temperature. Subsequently, the substrate temperature was raised to 1050° C. TMG and TMA were then supplied to the furnace, thereby forming a 2.5 nm layer of undoped $Al_{0.06}Ga_{0.94}N$. Subsequently, with no time interval allowed, the TMA valve was closed and a $Cp_2Mg$ valve was opened, thereby forming an Mg-doped GaN layer with a thickness of 2.5 nm.

By repeating this type of operation three times, and then forming an undoped $Al_{0.06}Ga_{0.94}N$ layer thereon, the p-type cladding layer 16a of a superlattice structure was formed.

Thereafter, only $Cp_2Mg$ and TMG were supplied to the furnace, by which the p-type contact layer 16b consisting of p-type GaN with a thickness of 200 nm was formed.

The thus produced epitaxial wafer for LED has a lamination structure in which: first, the intermediate layer 12 composed of an AlN layer of a single crystal structure is formed on the c-plane of the sapphire substrate 11; and thereafter, sequentially from the substrate 11 side, the underlayer 13 composed of an 8 μm undoped GaN layer, the n-type contact layer 14a composed of a 2 μm Si-doped GaN initial layer having an electron concentration of $5×10^{18}$ cm$^{-3}$ and a 200 nm Si-doped GaN regrown layer, the n-type cladding layer 14b having a Si concentration of $4×10^{18}$ cm$^{-3}$ and having a superlattice structure composed of 20 layers of 1.7 nm $Ga_{0.99}In_{0.01}N$ and 19 layers of 1.7 nm GaN, the light emitting layer 15 having a multiquantum well structure that begins with a GaN barrier layer and ends with a GaN barrier layer, the multiquantum well structure being composed of five Si-doped barrier layers 15a each having a layer thickness of 6 nm, five layers of undoped $Ga_{0.92}In_{0.08}N$ well layers 15b each having a layer thickness of 3 nm, and an uppermost barrier layer having a final barrier layer consisting of undoped GaN (equivalent to the uppermost barrier layer 15a in the light emitting layer 15 in FIG. 2), and the p-type semiconductor layer 16 composed of the p-type cladding layer 16a having a superlattice structure consisting of four layers of undoped $Al_{0.06}Ga_{0.94}N$ with a thickness of 2.5 nm and three layers of Mg-doped $Al_{0.01}Ga_{0.99}N$ with a thickness of 2.5 nm, and the p-type contact layer 16b consisting of Mg-doped GaN with a thickness of 200 nm, are formed.

<Formation of Electrodes>

Next, on the surface of the p-type contact layer 16b of the above-mentioned epitaxial wafer, a translucent positive electrode 17 consisting of IZO was formed by a conventionally known photolithography technique, and thereon a positive electrode 18 (positive electrode bonding pad) having a lamination structure consisting of chromium, titanium and gold in this order was formed. The wafer was then subjected to dry etching to expose a part of the n-type contact layer 14a for forming the n-side electrode (the negative electrode). Then, on this exposed domain 14d, the negative electrode 19 (the n-side electrode) was formed by sequentially depositing three layers of Cr, Ti, and Au. Through this procedure, respective electrodes having the shapes shown in FIG. 1 and FIG. 2 were formed on the wafer.

<Production of LED>

Each epitaxial wafer for LED produced by the method of Example mentioned above was used to prepare an LED.

The backside of the sapphire substrate 11 of the wafer having those electrodes formed by the above-mentioned procedure was ground or polished to make a mirror-like surface. The wafer was then cut into 350 μm-square chips, forming the type of light emitting device 1 shown in FIG. 1 and FIG. 2. The chip was then positioned on a lead frame with the respective electrodes facing upwards, and the electrodes were connected to the lead frame by gold wiring, thus forming a light emitting diode (LED) (see the lamp 3 in FIG. 4).

When a forward current was made to flow between the p-side and n-side electrodes of the thus produced light emitting diode, the forward voltage at a current of 20 mA was 3.1 V. In addition, the manner of light emission was observed through the p-side translucent positive electrode 17, as a result of which the emission wavelength was 452 nm and the light emission output power was 20 mW. It was confirmed that the characteristics of this kind of light emitting diode were less nonuniform, the light emission output power was large, and the emission wavelength was less nonuniform, throughout light emitting diodes produced from almost the entire surface of the thus produced wafer. The features of the substrate formed with semiconductor light emitting element produced in the Example 1 are summarized in Table 1.

<Amount of Warping H of the Sapphire Substrate>

The amount of warping H of the sapphire substrate was evaluated by the SORI value measured by the laser-based oblique incidence interferometer (flatness tester FT-17 manufactured by NIDEK Co., Ltd.). The SORI value was measured by adhering the sapphire substrate to a bow chuck of the flatness tester, and inclining the substrate forward at 8 degrees from the vertical direction. The measurement was done within a range excluding the 1 mm margin (inside value of 1 mm) of the sapphire substrate.

<Distribution of Emission Wavelength (Wavelength Distribution σ) from the Compound Semiconductor Wafer>

The measurement of the wavelength distribution σ of the emission wavelength is not limited in the present invention, although it is preferable to carry out the measurement with use of the PL mapper (manufactured by ACCENT: RPM-Σ).

Example 2

In the same manner as that of Example 1, a 4-inch (100 mm) sapphire substrate was prepared. A semiconductor light emitting element was formed on this substrate in the same manner as that of Example 1, with the exception that the thickness of the substrate, the amount of warping H (μm) at room temperature, the X-ray rocking curve half width of the (0002) plane (arcsec), and the X-ray rocking curve half width of the (10-10) plane (arcsec) were set at values shown in Table 1. The wavelength distribution σ was evaluated and was shown to be 3.2 nm, being within a preferable range.

Example 3

A 6-inch (150 mm) sapphire substrate was prepared. A semiconductor light emitting element was formed on this substrate in the same manner as that of Example 1, with the exception that the thickness of the substrate, the amount of warping H (μm) at room temperature, the X-ray rocking curve half width of the (0002) plane (arcsec), and the X-ray rocking curve half width of the (10-10) plane (arcsec) were set at values shown in Table 1. The wavelength distribution σ was evaluated and was shown to be 4.4 nm, being within a preferable range.

Example 4

In the same manner as that of Example 3, a 6-inch (150 mm) sapphire substrate was prepared. A semiconductor light emitting element was formed on this substrate in the same manner as that of Example 1, with the exception that the thickness of the substrate, the amount of warping H (μm) at room temperature, the X-ray rocking curve half width of the (0002) plane (arcsec), and the X-ray rocking curve half width of the (10-10) plane (arcsec) were set at values shown in Table 1. The wavelength distribution σ was evaluated and was shown to be 2.8 nm, being within a preferable range.

Comparative Example 1

In the same manner as that of Example 1, a 4-inch (100 mm) sapphire substrate was prepared. An intermediate layer and an underlayer were sequentially deposited to form a wafer on this substrate in the same manner as that of Example 1, with the exception that this substrate was left unwarped, and no control was conducted to particularly improve the crystallinity of the underlayer. Then, the semiconductor layer was formed on the underlayer in the same manner as that of Example 1, thereby producing a light emitting element. Using this light emitting element, a lamp as shown in the drawing was produced and evaluated in the same manner as that of the Examples.

In this Comparative Example 1, when up to the underlayer had been formed, the XRC full width at half maximum (FWHM) of the underlayer of the wafer were measured, showing that the (0002) half width was 110 arcsec and the (10-10) half width was 446 arcsec.

In addition, after the light emitting layer had been formed by the respective procedures mentioned above, the amount of warping H of the substrate was checked. The amount of warping toward the backside of the substrate which is the opposite side of the principal plane was 40 μm, meaning a large warping. An attempt was made to evaluate the wavelength distribution σ, but it was not possible to estimate the σ value and it was found to be immeasurable.

This warping of the substrate can be attributed to the difference in the coefficient of thermal expansion between the substrate and the group III nitride semiconductor layer, caused by the growth temperature during the formation of the light emitting layer.

Then, light emission characteristics of the lamp (LED) produced with use of the light emitting element of Comparative Example 1 were measured in the same manner as that of the Examples, showing that the forward voltage at a current of 20 mA was 3.1 V, the emission wavelength was 450 nm, and the light emission output power was 15 mW. By so doing, it was confirmed that the characteristics of the light emitting diodes produced in Comparative Example 1 were quite nonuniform per each light emitting diode produced from almost the entire surface of the thus produced wafer.

Comparative Example 2

A 6-inch (150 mm) sapphire substrate was prepared. A semiconductor light emitting element was formed on this substrate in the same manner as that of Example 1 or Comparative Example 1, with the exception that the thickness (mm) of the substrate was set to 1.2 mm, the amount of warping H (μm) at room temperature was set to 4.5 μm, and the X-ray rocking curve half width of the (0002) plane (arcsec) was set to 170 arcsec, and the X-ray rocking curve half width of the (10-10) plane (arcsec) was set to 350 arcsec. The wavelength distribution σ was evaluated and was shown to be 11.6 nm, meaning that the emission wavelength was quite nonuniform in the substrate.

TABLE 1

|  | Diameter of substrate (mm) | Thickness of substrate (mm) | Amount of warping H (μm) at room temperature | (0002) X-ray rocking curve half width (arcsec) | (10-10) X-ray rocking curve half width (arcsec) | Wavelength distribution σ of semiconductor wafer (nm) |
|---|---|---|---|---|---|---|
| Example 1 | 100 | 0.93 | −10 | 37 | 220 | 2.5 |
| Example 2 | 100 | 0.73 | −8.5 | 36 | 170 | 3.2 |
| Example 3 | 150 | 1 | −5.4 | 40 | 160 | 4.4 |
| Example 4 | 150 | 1.4 | −3.2 | 50 | 165 | 2.8 |
| Comparative Example 1 | 100 | 0.52 | 0 | 110 | 446 | Not measurable |
| Comparative Example 2 | 150 | 1.2 | −4.5 | 170 | 350 | 11.6 |

It is apparent from the above-mentioned results that the group III nitride semiconductor light emitting element of the present invention comprises a light emitting layer of excellent crystallinity, shows a favorable value of the wavelength distribution σ of the emission wavelength at 5 nm or smaller, and has excellent light emission characteristics. By so doing, the proportion of defective products produced from the substrate formed with the semiconductor light emitting element can be remarkably lowered.

BRIEF DESCRIPTION OF THE REFERENCE SYMBOLS

1: group III nitride semiconductor light emitting element (light emitting element), 3: lamp, 11: substrate, 11a: surface (substrate), 11b: substrate edge, 12: intermediate layer, 13: underlayer, 13a: surface (underlayer), 14: n-type semiconductor layer, 15: light emitting layer, 16: p-type semiconductor layer, 20: semiconductor layer, H: amount of warping

The invention claimed is:

1. A method for manufacturing a group III nitride semiconductor light emitting element, in which an intermediate layer, an underlayer, an n-type contact layer, an n-type cladding layer, a light emitting layer, a p-type cladding layer, and a p-type contact layer are laminated in sequence on a principal plane of a substrate, wherein
   a substrate having a diameter of 4 inches (100 mm) or larger, with having an amount of warping H within a range from 0.1 to 30 μm and at least a part of the edge of the substrate warping toward the principal plane at room temperature, is prepared as the substrate;
   a X-ray rocking curve full width at half maximum (FWHM) of a (0002) plane is 100 arcsec or less and a X-ray rocking curve FWHM of a (10-10) plane is 300 arcsec or less, in a state where the intermediate layer has been formed on the substrate and thereafter the underlayer and the n-type contact layer are formed on the intermediate layer; and
   furthermore the n-type cladding layer, the light emitting layer, the p-type cladding layer, and the p-type contact layer are formed on the n-type contact layer.

2. The method for manufacturing a group III nitride semiconductor light emitting element according to claim 1, wherein the X-ray rocking curve FWHM of the (0002) plane is 50 arcsec or less and the X-ray rocking curve FWHM of the (10-10) plane is 250 arcsec or less, in a state where the underlayer and the n-type contact layer are formed on the intermediate layer.

3. The method for manufacturing a group III nitride semiconductor light emitting element according to claim 1, wherein the substrate is a sapphire substrate, and the intermediate layer is formed on a c-plane of the sapphire substrate.

4. The method for manufacturing a group III nitride semiconductor light emitting element according to claim 1, wherein the intermediate layer is formed from $Al_XGa_{1-X}N$ ($0 \leq X \leq 1$).

5. The method for manufacturing a group III nitride semiconductor light emitting element according to claim 4, wherein the intermediate layer is formed from AlN.

6. The method for manufacturing a group III nitride semiconductor light emitting element according to claim 1, wherein the intermediate layer is formed by a sputtering method.

7. The method for manufacturing a group III nitride semiconductor light emitting element according to claim 1, wherein the underlayer is formed from AlGaN.

8. The method for manufacturing a group III nitride semiconductor light emitting element according to claim 1, wherein the underlayer is formed from GaN.

9. The method for manufacturing a group III nitride semiconductor light emitting element according to claim 1, wherein the underlayer is formed by an MOCVD method.

10. The method for manufacturing a group III nitride semiconductor light emitting element according to claim 1, wherein the underlayer is formed by a sputtering method.

11. The method for manufacturing a group III nitride semiconductor light emitting element according to claim 1, wherein a total thickness of the intermediate layer, the underlayer, and the n-type contact layer is set to 8 μm or larger.

12. A group III nitride semiconductor light emitting element produced by the manufacturing method according to claim 1.

13. A lamp comprising the group III nitride semiconductor light emitting element according to claim 12.

* * * * *